US007842437B2

(12) United States Patent
Belleson et al.

(10) Patent No.: US 7,842,437 B2
(45) Date of Patent: Nov. 30, 2010

(54) HIGH-RESOLUTION, PATTERNED-MEDIA MASTER MASK

(75) Inventors: James G. Belleson, Hillsborough, CA (US); Michael A. Parker, Fremont, CA (US); Robert O. Schwenker, San Jose, CA (US)

(73) Assignee: Hitachi Global Storage Technologies, Netherlands, B.V., Amsterdam (NL)

( * ) Notice: Subject to any disclaimer, the term of this patent is extended or adjusted under 35 U.S.C. 154(b) by 513 days.

(21) Appl. No.: 12/006,433

(22) Filed: Dec. 31, 2007

(65) Prior Publication Data

US 2009/0170010 A1 Jul. 2, 2009

(51) Int. Cl.
*G03F 9/00* (2006.01)
(52) U.S. Cl. ................. 430/5; 430/296; 430/942; 250/492.22; 250/492.3
(58) Field of Classification Search .............. 430/5, 430/296, 942; 250/492.22, 492.3
See application file for complete search history.

(56) References Cited

U.S. PATENT DOCUMENTS

| | | | |
|---|---|---|---|
| 4,463,265 A | 7/1984 | Owen et al. | |
| 5,336,892 A | 8/1994 | Dobisz et al. | |
| 5,451,835 A | 9/1995 | Yamazaki et al. | |
| 5,751,102 A | 5/1998 | Tanaka et al. | |
| 6,035,113 A | 3/2000 | Gerber et al. | |
| 6,281,513 B1 | 8/2001 | Takenaka | |
| 6,291,119 B2 | 9/2001 | Choi et al. | |
| 6,534,221 B2 | 3/2003 | Lee et al. | |
| 6,627,366 B2 | 9/2003 | Yang | |
| 6,730,922 B2 | 5/2004 | Lin et al. | |
| 6,953,644 B2 | 10/2005 | Ebi et al. | |

OTHER PUBLICATIONS

Lewis, H. W., "Multiple Scattering in an Infinite Medium", *Physical Review*, vol. 78, No. 5, (Jun. 1, 1950),526-530.
Wolff, P. A., "Theory of Secondary Electron Cascade in Metals", *Physical Review*, vol. 95, No. 1, (Jul. 1,1954),56-66.
Reimer, Ludwig "Scanning Electron Microscopy: Physics of Image Formation and Microanalysis", *Library of Congress Cataloging in Publication Data*, (1928),57-312.
Dapor, Maurizio "Electron-Beam Interactions with Solids: Application of the Monte Carlo Method to Electron Scattering Problems", *Springer-Verlag Berlin Heidelberg*, (2003),1-91.
Everhart, T. E., "Simple Theory Concerning the Reflection of Electrons from Solids", *Journal of Applied Physics, vol. 31, No. 8*, (Aug. 1960),1483-1490.
Shimizu, et al., "Monte Carlo Calculations of the Electron-Sample Interactions in the Scanning Electron Microscope", *Journal of Applied Physics, vol. 42, No. 1*, (Jan. 1971),387-394.
Shimizu, et al., "The Monte Carlo Technique as Applied to the Fundamentals of EPMA and SEM", *J.Appl. Phys., vol. 43, No. 10*, (Oct. 1972),4233.
Hawryluk, et al., "Energy Dissipation in a Thin Polymer Film by Electron Beam Scattering", *Journal of Applied Physics, vol. 45, No. 6*, (Jun. 1974),2551.
Murata, Kenji "Spatial Distribution of Backscattered Electrons in the Scanning Electron Microscope and Electron Microprobe", *Journal of Applied Physics, vol. 45, No. 9*, (Sep. 1974),4110-4117.
Hawryluk, et al., "Energy Dissipation in a Thin Polymer Film by Electron Beam Scattering: Experiment", *Journal of Applied Physics, vol. 46, No. 6*, (Jun. 1975),2528-2537.
Chang, T. H., "Proximity Effect in Electron-Beam Lithography", *J. Vac, Sci. Technology, vol. 12, No. 6*, (Dec. 1975),1271-1275.
Sickafus, E. N., "Linearized Secondary-Electron Cascades from the Surfaces of Metals. I. Clean Surfaces of Homogeneous Specimens", *Physical Review B, vol. 16, No. 4*, (Aug. 15, 1977),1436-1447.
Sickafus, E. N., "Linearized Secondary-Electron Cascades from the Surfaces of Metals. II. Surface and Subsurface Sources", *Physical Review B, vol. 16, No. 4*, (Aug. 15, 1977),1448-1459.
Sickafus, et al., "Linearized Secondary-Electron Cascades from the Surface of Metals. III. Line-Shape Synthesis", *Physical Review B, vol. 19, No. 8*, (Apr. 15, 1979),4056-4068.
Stephani, D. "Monte-Carlo Calculations of Backscattered Electrons at Registration Marks", *J. Vac. Sci. Technology, vol. 16, No. 6*, (Dec. 1979),1739-1742.
Jones, et al., "RD3D (Computer Simulation of Resist Development in Three Dimensions)", *IEEE Transactions on Electron Devices, vol. ED-28, No. 12*, (Dec. 1981),1544-1552.
Horiguchi, et al., "New Model of Electron Free Path in Multiple Layers for Monte Carlo Simulation", *Applied Physics Letter, vol. 39, No. 6*, (Sep. 1981),512-514.
Niedrig, H. "Electron Backscattering From Thin Films", *Journal of Applied Physics, vol. 53, No. 4*, (Apr. 1982),15-49.
Hawryluk, et al., "Addendum: New Model of Electron Free Path in Multiple Layers for Monte Carlo Simulation", *Journal of Applied Physics, vol. 53, No. 8*, (Aug. 1982),5985.
Kern, et al., "Practical Aspects of Microfabrication in the 100nm Regime", *J. Vac. Sci. Technology B, vol. 1, No. 4*, (Dec. 1983),1096-1100.
Petford-Long, et al., "High-Resolution Electron Microscopy Study of X-ray Multilayer Structures", *Journal of Applied Physics, vol. 61, No. 4*, (Feb. 15, 1987),1422-1428.

(Continued)

*Primary Examiner*—Christopher G Young

(57) ABSTRACT

A high-resolution, patterned-media master mask is disclosed. The high-resolution, patterned-media master mask includes an electron-absorption substrate for absorbing electrons from an electron beam (e-beam) during an e-beam exposure by an e-beam lithography process and suppressing a backscattering of the electrons based on an electron-backscattering-suppressing atomic number associated with a constituent atomic species of the electron-absorption substrate, wherein the electron-absorption substrate comprises a material composed of greater than fifty atomic percent of the constituent atomic species, and wherein the electron backscattering-suppressing atomic number is less than an atomic number eight. The high-resolution, patterned-media master mask further includes a patterned portion coupled with the electron-absorption substrate, wherein the patterned portion is patterned by the e-beam lithography process, and wherein a resolution of the patterned portion is increased in response to the electron-absorption substrate suppressing the backscattering of the electrons.

20 Claims, 8 Drawing Sheets

OTHER PUBLICATIONS

Kratschmer, et al., "Quantitative Analysis of Resolution and Stability in Nanometer Electron Beam Lithography", *J. Vac. Sci. Technology B, vol. 6, No. 6*, (Dec. 1988),2074-2079.

Dapor, Maurizio "Penetration of an Electron Beam in a Thin Solid Film: The Influence of Backscattering From The Substrate", *Physical Review B, vol. 43, No. 13*, (May 1, 1991),10118-10124.

Tanenbaum, et al., "High Resolution Electron Beam Lithography Using ZEP-520 and KRS Resists At Low Voltage", *J. Vac. Sci. Technology B, vol. 14, No. 6*, (Dec. 1996),3829-3833.

Henderson, Clifford L., "EBL", file://C:\JGB_Documents\e-beam\E-Beam Lithography Overview.htm, (Mar. 23, 2007),1-11.

James, et al., "The Theory of the Photographic Process: Fourth Edition", *Macmillan Publishing Co., Inc.*, (1977),501-597.

Wells, et al., "Scanning Electron Microscopy", *McGraw-Hill, Inc.*, (1974),52-203.

800

```
┌─────────────────────────────────────────────────────────────┐
│ Provide an electron beam (e-beam) resist comprising material│
│ that produces a latent image in the material in response to │
│ an exposure of the material to electrons during an e-beam   │
│ lithography                                                 │
│                            810                              │
└─────────────────────────────────────────────────────────────┘
                              │
                              ▼
┌─────────────────────────────────────────────────────────────┐
│ Select an electron-absorption substrate comprising a material│
│ composed of greater than fifty atomic percent of a constituent│
│ atomic species having an electron-backscattering-suppressing │
│ atomic number less than an atomic number eight              │
│                            820                              │
└─────────────────────────────────────────────────────────────┘
                              │
                              ▼
┌─────────────────────────────────────────────────────────────┐
│ Couple the e-beam resist with the electron-absorption       │
│ substrate such that the electron-absorption substrate is    │
│ configured to absorb the electrons during the e-beam        │
│ lithography                                                 │
│                            830                              │
└─────────────────────────────────────────────────────────────┘
                              │
                              ▼
┌─────────────────────────────────────────────────────────────┐
│ Utilize an e-beam to produce the latent image in the e-beam │
│ resist, wherein the latent image provides a representative  │
│ image of the physical pattern                               │
│                            840                              │
└─────────────────────────────────────────────────────────────┘
                              │
                              ▼
┌─────────────────────────────────────────────────────────────┐
│ Utilize the electron-absorption substrate to suppress a     │
│ backscattering of the electrons based on the electron-      │
│ backscattering-suppressing atomic number so as to decrease  │
│ an exposure of the e-beam resist to the backscattering of   │
│ the electrons                                               │
│                            850                              │
└─────────────────────────────────────────────────────────────┘
                              │
                              ▼
┌─────────────────────────────────────────────────────────────┐
│ Develop the latent image in the e-beam resist to produce the│
│ physical pattern, wherein the resolution of the physical    │
│ pattern is increased in response to the utilizing of the    │
│ electron-absorption substrate to suppress the backscattering│
│ of the electrons                                            │
│                            860                              │
└─────────────────────────────────────────────────────────────┘
```

FIG. 8

HIGH-RESOLUTION, PATTERNED-MEDIA MASTER MASK

TECHNICAL FIELD

Embodiments of the present technology relate to the field of electron beam (e-beam) lithography.

BACKGROUND ART

Over the years, computer systems have become increasingly important in human society. Word processing, database management and communication applications are just a few of the tools that modern computers offer. However, as the utilization of computer systems continues to increase, so does the need to store vast quantities of digital information. In view of this need, various data storage systems, such as hard-disk drives (HDDs), have been developed. In general, HDDs offer a low-cost and reliable means of storing computing information.

One of the fields of magnetic data storage involves the use of patterned-media. In one embodiment, data is recorded in uniform arrays of isolated magnetic islands, called magnetic grains, along the surface of a patterned layer, wherein a logical bit is stored in a single magnetic grain. However, since the achievable storage capacity of patterned media is dependent on the resolution of lithographic processing techniques used to fabricate these grains, a need exists for increasing the achievable resolution of fabricated grain patterns used in these media.

SUMMARY OF THE TECHNOLOGY

This Summary is provided to introduce a selection of concepts that are further described below in the Detailed Description. This Summary is not intended to identify key or essential features of the claimed subject matter, nor is it intended to be used as an aid in determining the scope of the claimed subject matter.

A high-resolution, patterned-media master mask is disclosed. The high-resolution, patterned-media master mask includes an electron-absorption substrate for absorbing electrons from an e-beam during an e-beam exposure by an e-beam lithography process and suppressing a backscattering of the electrons based on an electron-backscattering-suppressing atomic number associated with a constituent atomic species of the electron-absorption substrate, wherein the electron-absorption substrate comprises a material composed of greater than fifty atomic percent of the constituent atomic species, and wherein the electron backscattering-suppressing atomic number is less than an atomic number eight. The high-resolution, patterned-media master mask further includes a patterned portion coupled with the electron-absorption substrate, wherein the patterned portion is patterned by the e-beam lithography process, and wherein a resolution of the patterned portion is increased in response to the electron-absorption substrate suppressing the backscattering of the electrons.

BRIEF DESCRIPTION OF THE DRAWINGS

The accompanying drawings, which are incorporated in and form a part of this specification, illustrate various embodiments of the technology and, together with the description, serve to explain exemplary principles of the technology. Moreover, the drawings are used to illustrate principles of the illustrated embodiments, and are not intended to narrow the scope of these embodiments to the details illustrated therein.

FIG. 8 is a flowchart of a method of increasing a resolution of a physical pattern in a patterned-media master mask in accordance with an embodiment of the present technology.

Figure 1:
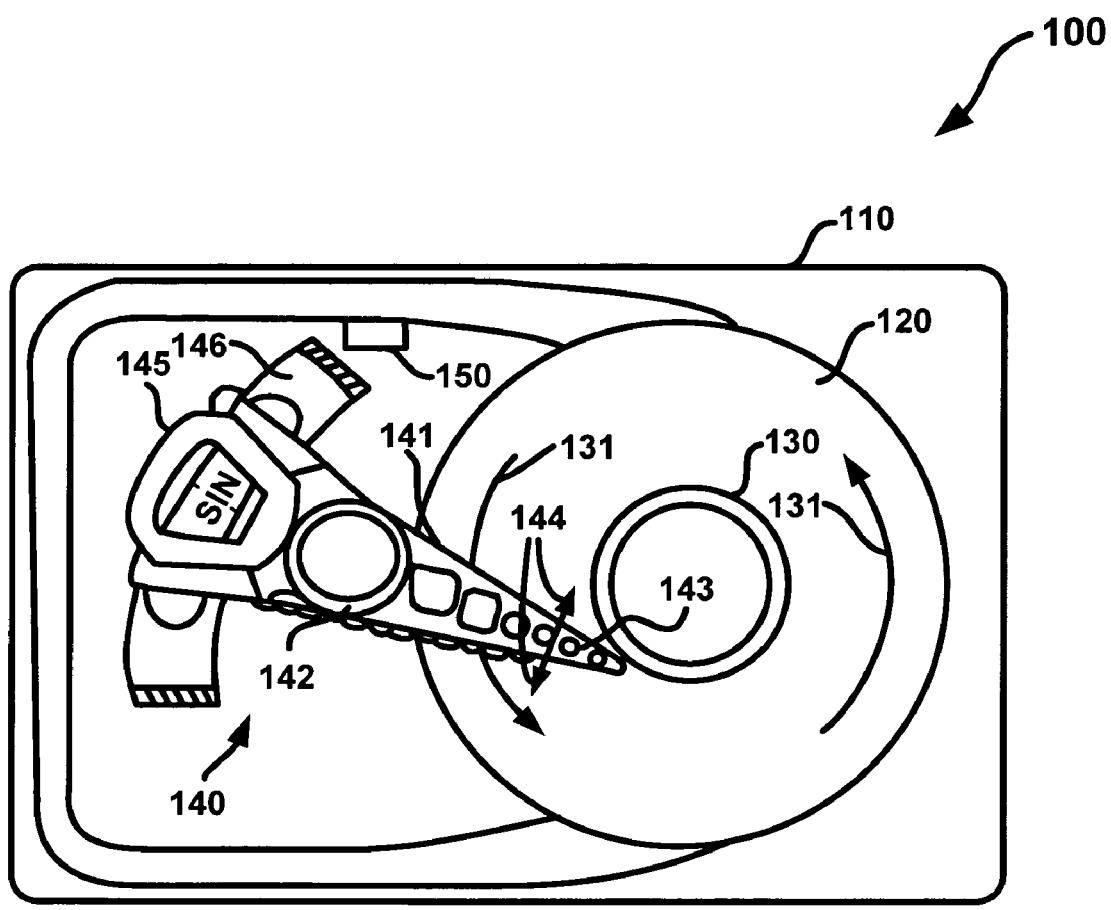
FIG. 1 is a diagram of an example HDD in accordance with an embodiment of the present technology.

Components described in the illustrated embodiments have not been drawn to scale. Therefore, neither the illustrated embodiments, nor the components illustrated therein, shall be limited to the size or scale of the illustrated objects.

DETAILED DESCRIPTION

Reference will now be made in detail to a number of embodiments of the present technology, examples of which are illustrated in the accompanying drawings. While the technology will be described in conjunction with various embodiments, these embodiments are not intended to limit spirit or scope of the present technology. On the contrary, the presented technology is intended to cover alternatives, modifications and equivalents, which may be included within the spirit and scope of the various embodiments as defined by the appended claims.

Furthermore, in the following detailed description of a number of aspects of the present technology, numerous specific details are set forth in order to provide a thorough understanding of the present technology. However, the present technology may be practiced without these specific details. In other instances, well known methods, procedures, and components have not been described in detail as not to unnecessarily obscure aspects of the present technology.

Overview

Hard-disk drives often utilize magnetic storage media to magnetically store data over time such that this data may be accessed at a future time. In an embodiment, the surface of a magnetic storage medium includes multiple magnetic grains used for magnetic recording purposes. Consider the example where the magnetic storage medium is a patterned medium. A magnetic grain on the surface of the storage medium is used as a single magnetic domain wherein a region of magnetic material on the surface of the patterned medium exhibits a net magnetization state that is interpreted by a magnetic-recording sensor as a single magnetic bit state.

In one example, a high-resolution, patterned-media master mask is created using an e-beam lithography process, wherein patterned latent images are generated in an e-beam resist layer by primary electrons in an e-beam. The contrast of these images with respect to the remainder of the e-beam resist layer defines a resolution of the lithographically generated pattern in the master mask. This resolution determines the minimum size and spacing of replication features corresponding to isolated islands of magnetic material, called magnetic grains, which determine the areal density and storage capacity of magnetic-recording media created using this master mask. Therefore, the generated latent image corresponds to a replication feature used as a template in the formation of a magnetic grain.

Pursuant to one embodiment, exposure to backscattered and secondary electrons in areas of the e-beam resist layer located adjacent to the latent image causes a "halo image" to be generated around the primary-electron latent image, which results in a specious broadening of the latent image due to electron exposure beyond the true outer dimensions of the latent image produced by the primary electrons within the diameter of the e-beam. Moreover, in one example, backscattered and/or secondary electrons associated with the creation of a first primary-electron latent image spill over into an area adjacent to a second primary-electron latent image, which enlarges the appearance and reduces the contrast of this second primary-electron latent image. Thus, in so much as backscattered and secondary electrons from the e-beam give rise to a secondary volume of exposed e-beam resist material around the primary-electron latent images, it is difficult to maintain the desired dimensions of the lithographically generated pattern, which adversely affects the pattern resolution of the master mask.

An embodiment provides a means of suppressing the number of electrons that come into contact with portions adjacent to these primary-electron latent images of the e-beam resist layer by suppressing the number of backscattering events that take place in the master mask during the e-beam exposure by the e-beam lithography process. An electron-absorption substrate is coupled beneath the e-beam resist layer, wherein the electron-absorption substrate is configured to absorb electrons based on an electron-backscattering-suppressing atomic number of the substrate. In this manner, electrons from the e-beam are absorbed away from the e-beam resist layer such that these electrons do not interact with a region of the e-beam resist layer adjacent to a primary-electron-exposed portion that defines the physical boundaries of the primary-electron latent image.

Moreover, one embodiment utilizes a directionally-filtering-backscattering layer to minimize the negative effects of electron backscattering events on the primary-electron latent images of the e-beam resist layer. Primary electrons from the e-beam pass through this directionally-filtering-backscattering layer, which is located between the e-beam resist layer and the electron-absorption substrate. However, the penetration of backscattered electrons, such as backscattered electrons in the electron-absorption substrate, into the e-beam resist layer is suppressed by this directionally-filtering-backscattering layer. Thus, whereas the electron-absorption substrate serves to minimize the number of backscattering events that occur during the e-beam exposure by the e-beam lithography process, the directionally-filtering-backscattering layer is utilized to protect the e-beam resist layer from exposure to those backscattered electrons that are nevertheless generated. This combination of electron absorption and e-beam resist shielding provides a means for increasing the resolution of primary-electron latent images in an e-beam resist layer.

The foregoing notwithstanding, an embodiment provides a means of further suppressing the number of electrons that come into contact with portions of the e-beam resist layer adjacent to primary-electron-exposed portions by sequestering secondary electrons away from the e-beam resist layer. In particular, an electric biasing paradigm is used so as to attract secondary electrons away from the e-beam resist layer of the fabricated master mask based on a kinetic energy associated with these electrons. For example, a voltage differential is applied across the electron-absorption substrate, and secondary electrons in the substrate are then attracted in a direction away from the e-beam resist layer based on the polarity and magnitude of the applied voltage.

In addition, an embodiment includes an etch-stop layer beneath the e-beam resist layer. This etch-stop layer is used to protect the vertical dimensions of the lithographically generated pattern in the high-resolution, patterned-media master mask during a patterning of the master mask. Indeed, the inclusion of an etch-stop layer in various other embodiments enables both lateral and vertical control over the dimensions of the replication feature in the high-resolution, patterned-media master mask.

Numerous specific embodiments will now be set forth in detail to provide a more thorough understanding of the present technology. The discussion of these detailed embodiments will begin with an overview of a HDD, and the components connected therein, according to embodiments of the present technology. The discussion will then focus on embodiments related to a patterned media as a magnetic-recording medium in HDDs.

Next, the discussion will focus on embodiments wherein the resolution of a high-resolution, patterned-media master mask is increased by suppressing the number of backscattered events that occur during an e-beam exposure of an e-beam resist layer in a master mask by the e-beam lithography process. The discussion will then focus on embodiments of the technology for minimizing the exposure of the e-beam resist layer to those backscattered electrons that have already been generated. Moreover, various embodiments for achieving both lateral and vertical control over the dimensions of an e-beam lithographically generated pattern of replication features will be discussed.

Finally, the discussion will focus on embodiments for sequestering electrons from the vicinity of the e-beam resist layer in a master mask based on the respective kinetic energies of these electrons. In addition, various methods of operation will be explored, wherein exemplary procedures are detailed for achieving an increased resolution for e-beam lithography of replication features in a high-resolution, patterned-media master mask.

Hard-Disk-Drive (HDD) Configuration

With reference now to FIG. 1, an example HDD 100 in accordance with an embodiment is shown. HDD 100 is configured to be implemented by a computer system as an information storage system. In one example, HDD 100 receives electronic data, such as electronic data pertaining to an electronic file associated with an electronic computing device, and magnetically stores information that is ascertained from the received electronic data. The stored information is then magnetically accessed at a future time, and this information is utilized to regenerate the received electronic data.

With reference still to FIG. 1, HDD 100 has an outer housing or base 110 containing a disk pack comprising at least one magnetic-recording disk 120. A spindle motor assembly with central drive hub 130 rotates magnetic-recording disk 120 in a circular direction. In this way, magnetic-recording disk 120 is rotated within outer housing or base 110 by spindle motor assembly with central drive hub 130 such that data is read from and written to various points on the surface of magnetic-recording disk 120 by a magnetic read/write transducer or head (not shown).

HDD 100 further includes an actuator assembly 140 that includes at least one actuator arm 141 that is movably or pivotally mounted to outer housing or base 110 about a pivot assembly 142. The magnetic read/write transducer or head is mounted to a lead suspension 143 that is disposed on at least one actuator arm 141 such that a movement of at least one actuator arm 141 allows the magnetic read/write transducer or head to magnetically read data from and magnetically write data to different locations on the surface of magnetic-recording disk 120.

The embodiment illustrated in FIG. 1 further includes a voice coil 145 mounted on at least one actuator arm 141 such that voice coil 145 is free to move within a conventional voice coil motor magnet assembly 146 (top pole not shown). In one embodiment, a controller 150 is also mounted to outer housing or base 110, and is used to selectively move at least one actuator arm 141 in one or more directions (illustrated by arrows 144) relative to magnetic-recording disk 120.

Patterned-Media Overview

In an effort to increase the storage capacity of magnetic storage media, the magnetic grains used for magnetically storing data in such media are oftentimes scaled smaller. For example, a storage capacity of 200 gigabits can be increased to 700 gigabits by scaling down the size of the magnetic grains such that a greater number of such grains may be present an the magnetic-recording-disk surface. However, decreasing the size of these magnetic grains sometimes decreases drive reliability since the smaller grains are often thermally unstable, causing data to be inadvertently erased. Thus, thermal stability issues can cause the effective realization of significant recording-density increases with such media to become difficult when these density increases are based on scaling alone.

One embodiment provides that a recording density associated with a magnetic-recording-disk surface is increased by utilizing a different type of recording layer. Consider the example where a patterned-layer is utilized as a magnetic-storage layer of magnetic-recording disk 120, wherein a grain within a pattern of the patterned-layer constitutes a single domain magnetic "island" that acts as a logical bit cell. This implementation allows recording densities in excess of a terabit to be achieved since a logical bit is stored using a single grain rather than many grains, causing the surface area of a magnetic-storage layer of magnetic-recording disk 120 to be utilized more efficiently.

In one embodiment, the diameter of the magnetic islands is in the range of 10 to 20 nanometers. Narrowing the diameter of these islands frees up space on the surface of magnetic-recording disk 120 such that a greater number of patterned-layer grains, storage cells, may be positioned on the surface of magnetic-recording disk 120. This allows the recording capacity of magnetic-recording disk 120 to be further increased.

Once a particular pattern for these islands is selected, a high-resolution, patterned-media master mask can be used to mass produce magnetic storage media having this pattern. In one embodiment, a high-resolution, patterned-media master mask is fabricated, and this master mask is used to create a number of imprinted magnetic-recording-disk substrates. For example, the fabrication of the master mask includes providing a master mask with a patterned array of protrusions, replication features that correspond to the dimensions of the uniform arrays. The protrusions of the master mask are then imprinted into various daughter molds, and these daughter molds are used to stamp the pattern of the master mask into a number of magnetic-recording-disk substrates. This two-tier imprinting process allows many replicas to be made from a single master mask.

Although various methods exist for producing magnetic storage media, a number of embodiments utilize e-beam lithography to create the high-resolution, patterned-media master mask. In general, e-beam lithography includes the use of a beam of electrons to generate latent images of physical patterns in an e-beam resist layer. Normally, this process of pattern generation is serial, wherein an e-beam is scanned across a surface to be patterned. Moreover, modern e-beam lithography equipment generally allows the probe diameter of an e-beam to be as narrow as a few nanometers.

Figure 2:
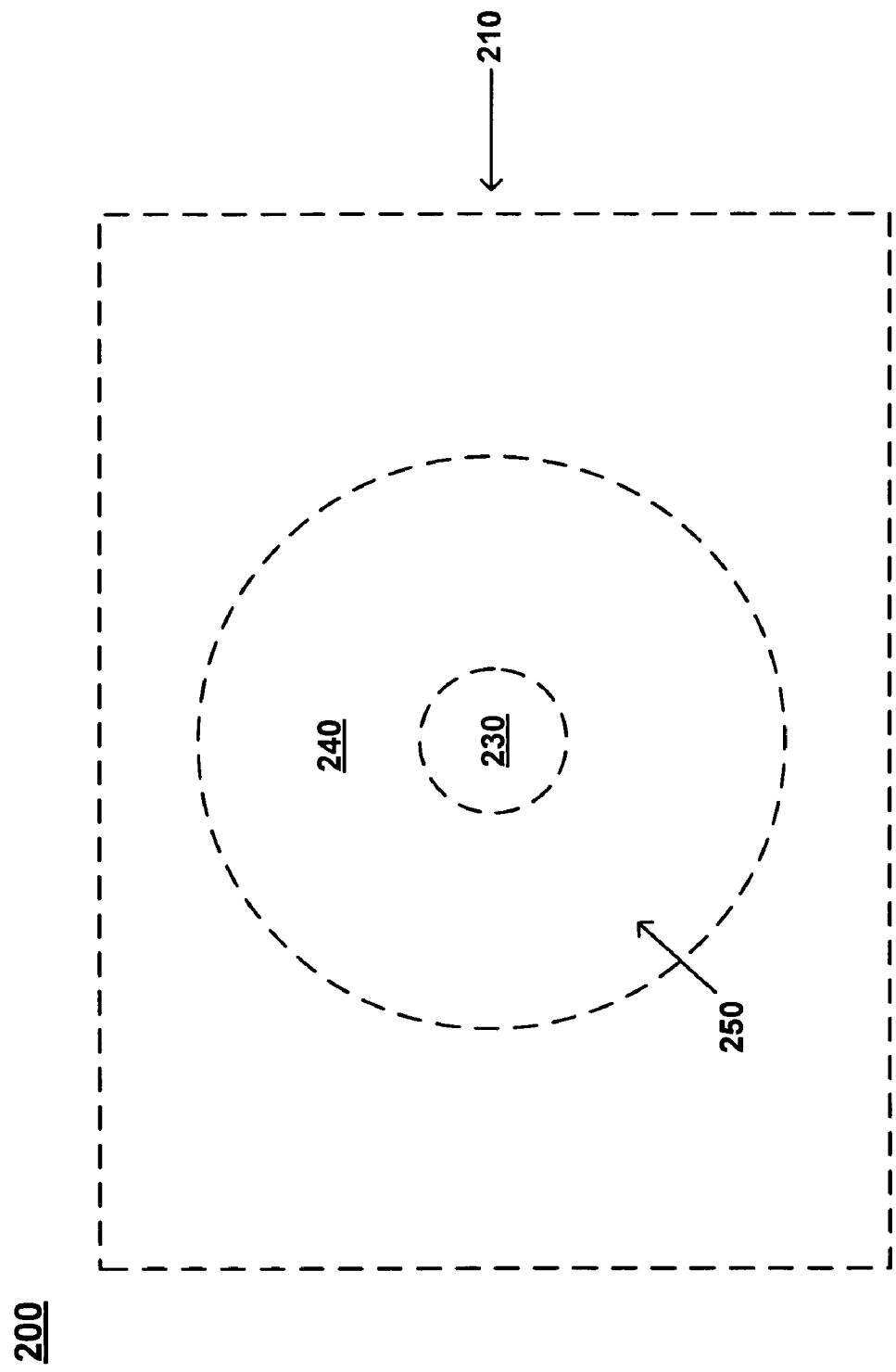
FIG. 2 is a plan view of an example exposure distribution in accordance with an embodiment of the present technology.

With reference now to FIG. 2, an example exposure distribution 200 in accordance with an embodiment is shown. A first portion 220 of an e-beam resist layer 210 is shown, and a primary-electron-exposed portion 230 is illustrated therein. The dimensions of primary-electron-exposed portion 230 represent a physical pattern of a logical bit cell that is to be imprinted on the surface of a magnetic-recording-disk substrate. Consider the example where primary-electron-exposed portion 230 has a diameter of approximately 10 to 20 nanometers, and this dimension corresponds to the diameter of a logical bit cell in an imprinted magnetic-recording-disk substrate.

In one embodiment, polymethyl methacrylate (PMMA) is used as e-beam resist layer 210. PMMA is a synthetic polymer of methyl methacrylate that acts as a positive e-beam resist during the e-beam exposure by the e-beam lithography process. Exposure to electrons from the e-beam causes molecular bonds within the PMMA to be broken, thus allowing for a selective removal during the e-beam resist development process of areas of the PMMA layer that are exposed to the e-beam, such as primary-electron-exposed portion 230.

With reference still to FIG. 2, secondary electrons generated by the primary e-beam during the e-beam exposure of e-beam resist layer 210, as well as back-scattered electrons from the substrate, give rise to a second portion 240 of material in e-beam resist layer 210 that is exposed to electrons during the e-beam exposure by the e-beam lithography process. Although second portion 240 is shown in FIG. 2 as having a well-defined diameter, this configuration is provided to illustrate various principles in accordance with an embodiment. In an alternative embodiment, a more significant portion of e-beam resist layer 210 has some finite probability of being exposed to backscattered electrons, because backscattered electrons depart from the substrate in different directions and at different angles. Therefore, the dashed circle denotes an exemplary boundary of second portion 240, within which is produced a significant amount of exposure in e-beam resist layer 210 that is outside of primary-electron-exposed portion 230. As a result of this exposure, a so-called "halo" 250 surrounds primary-electron-exposed portion 230.

The size of halo 250 depends on a variety of factors. Exemplary factors may include, but are not limited to, the resist sensitivity to electron exposure, the rate of development of the exposed portion depending on temperature and concentration of the developing reagents used, and the amount of exposure of the region surrounding primary-electron-exposed portion 230 to extraneous fluxes of electrons arriving from the substrate. The exposure to such extraneous electrons, other than those of the primary electrons of the e-beam, results in halo 250 being created around primary-electron-exposed portion 230. Halo 250 causes a specious broadening of the latent image due to electron exposure beyond the true outer dimensions of primary-electron-exposed portion 230 with respect to first portion 220. Therefore, the effects of backscattered and secondary electrons on e-beam resist layer 210 determine the obtainable resolution of the master mask in light of the degradation due to a "halo effect" around the primary-electron-beam generated latent image.

In one example, the resolution of the lithographically generated pattern in the master mask is further degraded due to a "proximity effect" involving two or more patterned latent images in e-beam resist layer 210. Backscattered and/or secondary electrons associated with the creation of a first latent image spill over into an area adjacent to a second latent image, which enlarges the appearance and reduces the contrast of this second image. In an embodiment, the negative impact of this "proximity effect" on pattern resolution increases as the spacing between latent images in e-beam resist layer 210 decreases, since a greater number of electrons will come into contact with areas of e-beam resist layer 210 that are located adjacent to various latent images created therein, as the background due to these secondary and backscattered electrons increases. Moreover, degradation occurs in the peak to background ratio for the primary-electron latent images, which causes the controlling of the lateral dimensions of pattern features in e-beam resist layer 210 to become increasingly difficult in the development process.

To further illustrate, for example, the effect of the peak to background ratio on the latent-image contrast of primary-electron-exposed portion 230 with respect to second portion 240 on development of the latent image of primary-electron-exposed portion 230 is analogous to the photographic scenario of attempting to obtain a high contrast print from a negative that is heavily "fogged." "Fogging" of a photographic negative is often due to exposure of the photographic emulsion to spurious sources of light, such as from leakage of light into a camera chamber. These spurious sources of light may cause a blanket exposure of the entire photographic emulsion, so that contrast from features in the latent image from the true exposure is degraded. Thus, the signal intensity associated with the latent image is riding on a spurious background intensity associated with this blanket exposure that, depending on the intensity of the spurious source of light, can significantly degrade the contrast from the latent image upon development of the negative.

With reference to the previous example, when attempting to detect a small signal on a high background, clarity of detail is lost from the negative upon development, in effect reducing the resolution of fine features, so that a print from the negative similarly lacks clarity of detail. The latent image of primary-electron-exposed portion 230 is similarly degraded by the presence of exposure events caused therein by sources other than the e-beam 310, such as secondary electrons and backscattered electrons, so that clarity of detail is lost from the e-beam resist layer 210, in effect reducing the resolution of fine features therein.

Figure 3:
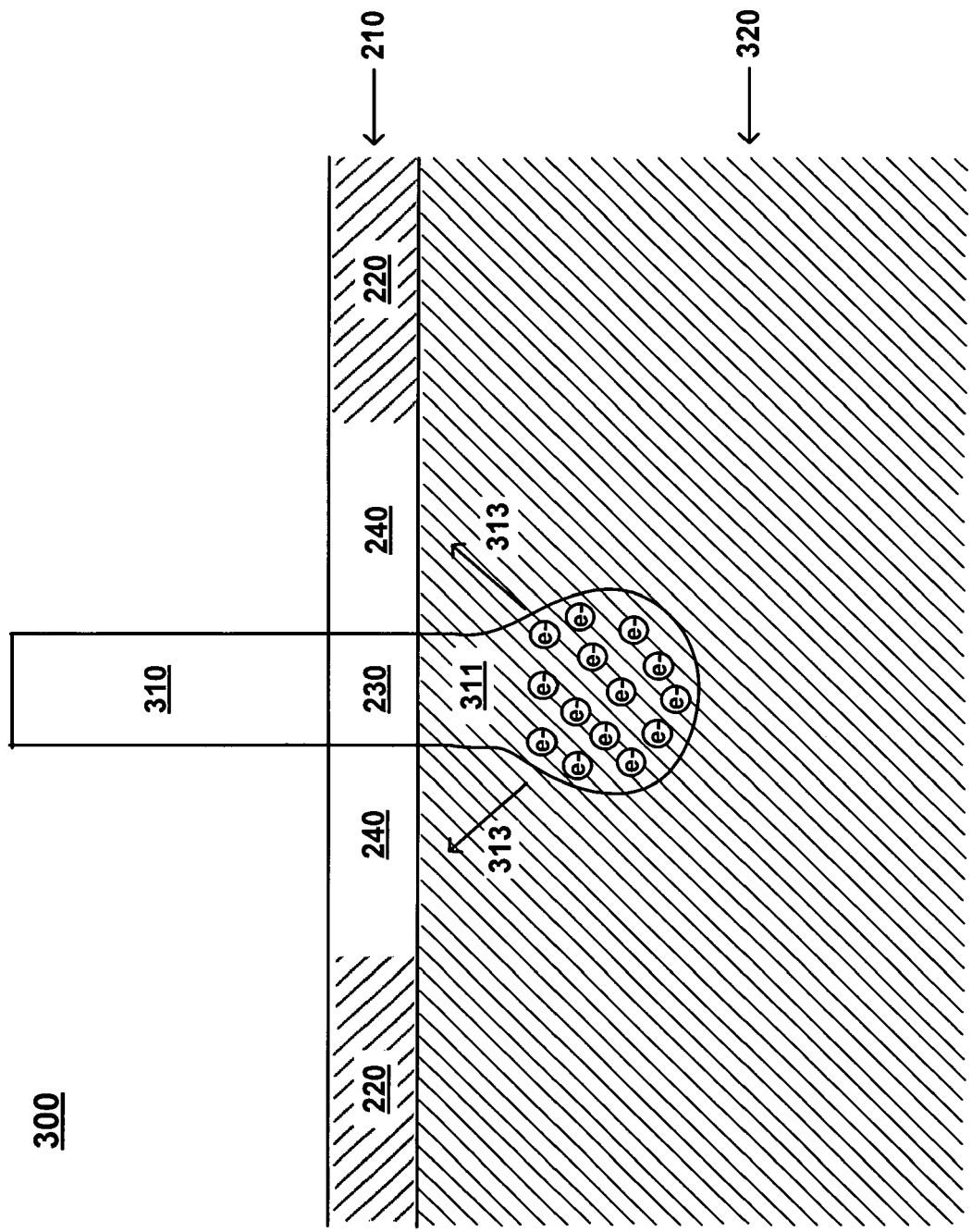
FIG. 3 is a cross-sectional view of an electron backscattering event in accordance with an embodiment of the present technology.

With reference now to FIG. 3, an electron backscattering event 300 in accordance with an embodiment is shown. Electron backscattering event 300 involves an e-beam exposure by the e-beam lithography process, using e-beam 310, of a master mask including e-beam resist layer 210 disposed on an electron-penetrable substrate 320. E-beam resist layer 210 includes a material, such as PMMA, that is removed from e-beam resist layer 210, after such material is bombarded by electrons during the e-beam exposure by the e-beam lithography process of the master mask, and upon subsequent development to remove the exposed material at the location of the latent image formed by electron exposure.

As shown in FIG. 3, e-beam resist layer 210 includes first portion 220 and primary-electron-exposed portion 230. First portion 220 has not come into contact with electrons from e-beam 310, and therefore, the material of e-beam resist layer 210 in first portion 220 has not been exposed to the primary-electron beam. However, material in primary-electron-exposed portion 230 has been exposed as a result of electrons from e-beam 310 coming into contact with such material. A contrast at the edge of primary-electron-exposed portion 230 with second portion 240 affects a resolution of the pattern generated in e-beam resist layer 210 by e-beam 310, since the exposure gradient at this edge defines the outer boundaries of the latent image created during the e-beam exposure by the e-beam lithography process. Excess exposure at the edge of primary-electron-exposed portion 230 broadens the outer boundaries of the latent image, resulting in a patterned feature that is larger than the dimensions of primary-electron-exposed portion 230 upon development of the latent image.

With reference still to FIG. 3, electrons 311 from e-beam 310 penetrate electron-penetrable substrate 320 after electrons 311 have passed through primary-electron-exposed portion 230. Once inside electron-penetrable substrate 320, electrons 311 collide with atoms of electron-penetrable substrate 320, which causes electrons 311 to disperse within electron-penetrable substrate 320 and/or backscatter toward e-beam resist layer 210, such as in example backscattering directions 313.

The portion of electrons 311 that contact second portion 240 in e-beam resist layer 210 cause molecular bonds in second portion 240 to be broken such that material in second portion 240 is exposed. This exposure of material in second portion 240 causes a "halo effect" around primary-electron-exposed portion 230, such as in example exposure distribution 200. This halo effect causes a specious broadening of the latent image due to electron exposure beyond the true outer dimensions of primary-electron-exposed portion 230 with respect to first portion 220, which adversely affects the resolution of the lithographically created pattern in the master mask.

High-Resolution, Patterned-Media Master Mask Fabrication

One embodiment provides a means to suppress the negative effect of halo 250 on the resolution of the lithographically created pattern by minimizing the size of halo 250 relative to first portion 220 and primary-electron-exposed portion 230. In one example, this is accomplished by sequestering the backscattered and secondary electrons away from the location of the primary-electron latent image formed in e-beam resist layer 210 by e-beam 310.

Figure 4:
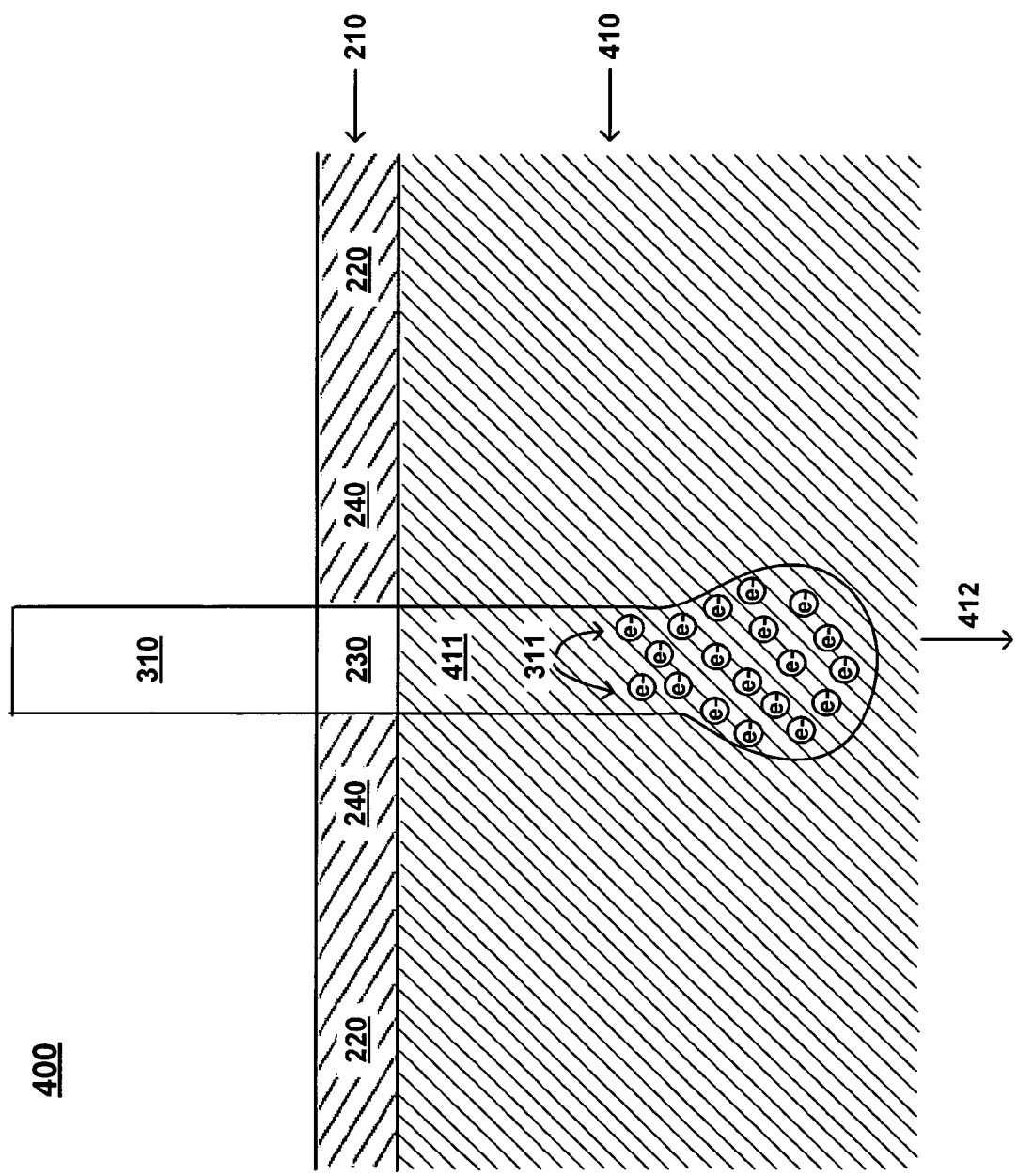
FIG. 4 is a cross-sectional view of a first master mask fabrication configuration in accordance with an embodiment of the present technology.

With reference now to FIG. 4, a first master mask fabrication configuration 400 in accordance with an embodiment is shown. A latent image of a physical pattern is generated in the high-resolution, patterned-media master mask wherein e-beam resist layer 210 is disposed on an electron-absorption substrate 410 of the high-resolution, patterned-media master mask. E-beam 310 is used to expose material from e-beam resist layer 210 so as to create primary-electron-exposed portion 230. A gradient in the exposure intensity distribution at the edge of primary-electron-exposed portion 230 defines a resolution of a lithographically generated latent image in the master mask.

With reference still to FIG. 4, electron-absorption substrate 410 absorbs electrons 311 from e-beam 310 during the e-beam exposure by the e-beam lithography process of e-beam resist layer 210. Moreover, electron-absorption substrate 410 suppresses a backscattering of electrons 311 toward second portion 240 based on an electron-backscattering-suppressing atomic number associated with electron-absorption substrate 410. In this manner, the halo effect around primary-electron-exposed portion 230 is minimized, which causes the resolution of the latent image of the physical pattern of the fabricated master mask to be increased.

For example, and with reference again to FIG. 3, whereas electrons 311 collide with atoms in electron-penetrable substrate 320 so as to backscatter toward second portion 240 in example backscattering directions 313, electrons 311 in first master mask fabrication configuration 400 are absorbed by electron-absorption substrate 410 such that electrons 311 remain in a tight pattern (represented by area 411). This is due to the electron-backscattering-suppressing atomic number of electron-absorption substrate 410, which is less than the atomic number of electron-penetrable substrate 320. Electrons 311 are able to penetrate more deeply into electron-absorption substrate 410 in a forward direction 412 away from e-beam resist layer 210 because electrons 311 do not backscatter from atoms in electron-absorption substrate 410 as frequently as from electron-penetrable substrate 320. This suppresses the backscattering of electrons toward second portion 240, which in turn reduces the halo effect around primary-electron-exposed portion 230.

Thus, the electron-backscattering-suppressing atomic number of electron-absorption substrate 410 is controlled so as to increase the resolution of the lithographically created pattern in the fabricated master mask by allowing electron-absorption substrate 410 to absorb electrons 311 in forward direction 412 such that a contribution of second portion 240 to halo 250 is minimized. In this manner, a resolution of an edge of primary-electron-exposed portion 230 is increased in response to electron-absorption substrate 410 suppressing the backscattering of electrons 311.

In one embodiment, the probability, P, of an electron scattering event occurring in electron-absorption substrate 410 can be approximately modeled as being proportional to the density, $\rho$, of electron-absorption substrate 410, as well as to a monotonically increasing function, $f(Z)$, of the atomic number, Z, of electron-absorption substrate 410. This probability can therefore be modeled as $P=k\times\rho\times f(Z)$, where k is a constant of proportionality. Therefore, by reducing the atomic number, Z, of electron-absorption substrate 410, it is possible to significantly reduce the number of electrons that are backscattered toward second portion 240. This reduction consequently suppresses the number of electrons that contribute to the latent image of halo 250 around the primary-electron latent image in e-beam resist layer 210.

Electron-penetrable substrate 320 may be a silicon (Si) substrate, and the backscattering of electrons 311 toward second portion 240 are a function of the atomic number of Si. Therefore, in one embodiment, electron-absorption substrate 410 includes a material having an atomic number substantially less than the atomic number of Si, which is fourteen. This allows electron-absorption substrate 410 to realize a greater degree of electron absorption such that electron-absorption substrate 410 absorbs electrons 311 during an e-beam exposure by the e-beam lithography process of e-beam resist layer 210 and simultaneously suppresses an electron backscattering event associated with electron-absorption substrate 410.

In general, various materials may be used to create electron-absorption substrate 410. In one embodiment, an electron backscattering coefficient, $\eta$, which is defined as the fraction of electrons backscattered out of electron-absorption substrate 410 versus the incident number of electrons entering electron-absorption substrate 410, increases as the electron-backscattering-suppressing atomic number is increased, with $\eta$ approaching 50% when electron-absorption substrate 410 consists of gold (Au). In particular, when comparing silicon and carbon (C), which have atomic numbers 14 and 6 respectively, electron backscattering coefficient, $\eta$ drops from 16% for silicon to 5% for carbon. Therefore, in one embodiment, the number of backscattered electrons is suppressed by using a carbon substrate as electron-absorption substrate 410. For example, the use of a carbon substrate versus a silicon substrate reduces the number of backscattered electrons by a factor of approximately 3 or more, which reduces the size of the latent image of halo 250 around primary-electron-exposed portion 230 that would otherwise broaden the apparent dimensions of the latent image of primary-electron exposed portion 230 in the master mask.

Various other materials may also be used to create electron-absorption substrate 410. In one embodiment, electron-absorption substrate 410 includes a material having an atomic number substantially less than that of silicon. Consider the example where a significant number, such as greater than fifty atomic percent, of constituent atomic species in electron-absorption substrate 410 have electron-backscattering-suppressing atomic numbers less than an atomic number eight. This is exclusive, for example, of various trace atomic impurities that may be present in the material. In order to obtain a significant effect from the reduction of backscattered electrons coming from electron-absorption substrate 410 most of the constituent atomic species composing the material of electron-absorption substrate 410 have electron-backscattering-suppressing atomic numbers less than an atomic number eight. In so much as the atomic number of silicon is fourteen, the electron-backscattering-suppressing atomic numbers of these constituent atomic species are less than the atomic number of silicon.

In one embodiment, electron-absorption substrate 410 includes a material composed of greater than fifty atomic percent of the constituent atomic species. For example, electron-absorption substrate 410 includes a material selected from a group consisting of carbon (C), pyrolytic graphite, diamond-like carbon (DLC), cathodic-arc carbon (CAC), lithium (Li), beryllium (Be), boron carbide ($B_4C$), boron nitride (BN), and nitride of carbon ($CN_x$). As the highest atomic number of constituent atomic species in these materials is that of nitrogen, which has atomic number seven, a significant number of constituent atomic species in electron-absorption substrate 410 have electron-backscattering-suppressing atomic numbers less than an atomic number eight, which is substantially less than the atomic number of Si, which is fourteen.

In an alternative embodiment, electron-absorption substrate 410 includes diamond-like carbon (DLC). DLC exhibits mechanical properties similar to those of diamond. DLC is relatively mechanically hard, and therefore is an attractive material for use as a substrate in a high-resolution, patterned-media master mask. Therefore, an embodiment utilizes a mechanically hard, electron-absorption substrate 410 comprising DLC disposed under e-beam resist layer 210. In subsequent fabrication of daughter molds, the DLC master mask realizes a longer life span than similar masks made from silicon, or other materials that are less durable than DLC. The DLC substrate is used as both an electron-absorption substrate 410 and a patterned portion of the high-resolution, patterned-media master mask. The master mask is patterned by the e-beam lithography process, and the patterned portion includes a patterned surface portion of the DLC substrate.

The patterned surface portion of the DLC substrate is but one example of a patterned portion of the high-resolution, patterned-media master mask that may include a patterned surface portion of alternative substrates wherein a significant number, such as greater than fifty atomic percent, of constituent atomic species in electron-absorption substrate 410 have electron-backscattering-suppressing atomic numbers less than an atomic number eight. Due to the properties of DLC, which make the material both mechanically strong and patternable using the e-beam lithography process, the mechanically hard electron-absorption substrate 410 including DLC provides two functions: it absorbs electrons during the e-beam exposure by the e-beam lithography process, and it serves as a mechanically hard patterned layer in the high-resolution, patterned-media master mask.

Pursuant to an embodiment, the DLC substrate is produced using a fabrication technique, such as chemical vapor deposition, ion beam deposition, plasma vapor deposition, microwave assisted vapor deposition, and cathodic arc deposition. In one example, cathodic-arc carbon, which is a species of DLC, is used to create electron-absorption substrate 410. In particular, carbon is deposited using a cathodic arc deposition process, wherein ions are emitted from a cathode so as to create a mechanically hard and thick carbon deposit on a temporary substrate that may be later removed to leave a free standing substrate of mechanically hard carbon to be used as electron-absorption substrate 410. In an alternative embodiment, cathodic-arc carbon is deposited on a substrate such as beryllium to provide both an electron-absorbing and mechanically hard layer on the surface of electron-absorption substrate 410.

Moreover, an embodiment provides that a thin film of DLC is deposited over another material having an even lower backscattering coefficient than carbon. For example, a thin layer of DLC having a nominal thickness of 100 nanometers is disposed on a material having an even lower atomic number than the DLC layer, such as beryllium. The relatively low atomic number of beryllium allows the electron absorbing power of electron-absorption substrate 410 to be further increased, and the encapsulation of the beryllium by the DLC layer helps to minimize the incident toxicity of the beryllium in the master mask. Moreover, whereas thick DLC deposits can sometimes crack or peel due to residual stresses remaining therein after deposition, the deposition of a thin DLC layer provides the additional advantage of providing greater mechanical reliability, which serves to increase the potential life span of the master mask.

The foregoing notwithstanding, the materials described herein have been presented as example compositions for fabricating a master mask pursuant to various embodiments, and are not meant to narrow the spirit or scope of the present technology. In other embodiments, different materials, and methodologies of combining these materials, may be used. To illustrate, consider the example where boron carbide is used to fabricate electron-absorption substrate 410. In an alternative embodiment, boron carbide substitutes for the DLC layer used to cover or encapsulate a material having a lower atomic number than carbon.

Therefore, different embodiments exist for configuring electron-absorption substrate 410 so as to effectively absorb electrons during an e-beam exposure by the e-beam lithography process of a master mask so as to reduce a halo effect around the primary-electron latent image. However, an embodiment provides that the probability of an electron scattering event occurring in electron-absorption substrate 410 is linearly proportional to the density of the material including electron-absorption substrate 410, and electron-absorption substrate 410 is configured to resist a backscattering of electrons 311 toward second portion 240 based on an electron-backscattering-suppressing density of electron-absorption substrate 410. Thus, minimizing a density of electron-absorption substrate 410 allows electrons 311 to more easily travel in forward direction 412 because there is a lower probability of electrons 311 colliding with atoms in electron-absorption substrate 410. In one example, electron-absorption substrate 410 has an electron-backscattering-suppressing density that is less dense than a density of carbon (C).

The foregoing notwithstanding, an embodiment provides that aerogels or xerogels are utilized to further reduce the electron-backscattering-suppressing density of electron-absorption substrate 410. Aerogels and xerogels exhibit extraordinary low density properties, substantially less dense than a density of carbon (C), which make them attractive for use in the various electron absorption implementations at issue. In one embodiment, a relatively thick layer of aerogel or xerogel is utilized as electron-absorption substrate 410, and this layer has a thickness substantially greater than the electron penetration depth therein. This thick layer is fabricated on a rigid supporting substrate to facilitate handling in subsequent fabrication and manufacturing operations. A suitable support substrate could include materials such as silicon, sapphire, or various ceramic materials known in the art of thin film fabrication process technology.

Figure 5:
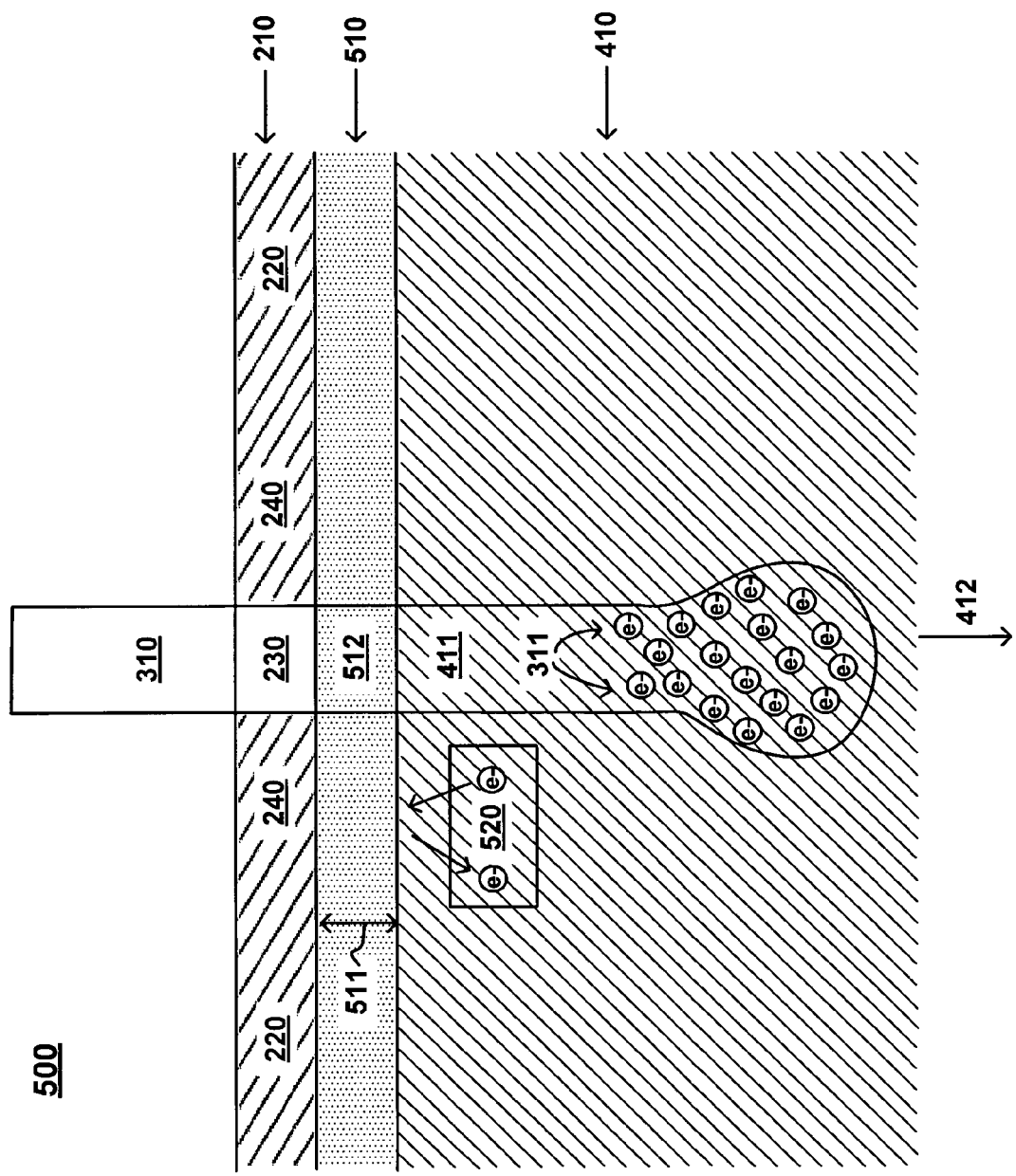
FIG. 5 is a cross-sectional view of a second master mask fabrication configuration in accordance with an embodiment of the present technology.

With reference now to FIG. 5, a second master mask fabrication configuration 500 in accordance with an embodiment is shown. A majority of electrons 311 are able to pass into the electron-absorption substrate 410 in forward direction 412. However, a number of electrons 311 collide with atoms in electron-absorption substrate 410 and are backscattered toward second portion 240 of e-beam resist layer 210. Thus, even though the halo effect around primary-electron-exposed portion 230 has been minimized due to the electron-backscattering-suppressing atomic number of electron-absorption substrate 410, in one embodiment, a small amount of electron backscattering still takes place.

An embodiment further increases the resolution of the primary-electron latent image in a master mask produced by the e-beam exposure by the e-beam lithography process by further decreasing the halo effect around primary-electron-exposed portion 230. With reference still to FIG. 5, a master mask is fabricated wherein a directionally-filtering-backscattering layer 510 is disposed between e-beam resist layer 210 and electron-absorption substrate 410. Directionally-filtering-backscattering layer 510 permits a penetration of electrons 311 from e-beam 310 such that electrons 311 pass through directionally-filtering-backscattering layer 510 and enter electron-absorption substrate 410. In addition, a number of these electrons 311 collide with atoms in electron-absorption substrate 410 and are backscattered toward second portion 240 of e-beam resist layer 210. However, directionally-filtering-backscattering layer 510 suppresses the penetration of backscattered electrons 520 into the e-beam resist layer 210. In particular, backscattered electrons 520 are deflected by directionally-filtering-backscattering layer 510 such that fewer backscattered electrons 520 are able to reach second portion 240.

With reference still to FIG. 5, directionally-filtering-backscattering layer 510 includes a thin layer of material having a higher atomic number or density than electron-absorption substrate 410, such as tantalum pentoxide ($Ta_2O_5$) having a mean atomic number of approximately 26.6, or tantalum (Ta) having a mean atomic number of 73, and this thin, directionally-filtering-backscattering layer 510 is disposed directly beneath e-beam resist layer 210. The vertical thickness 511 of directionally-filtering-backscattering layer 510 is chosen such that it is less than the thickness at which significant horizontal broadening of electron penetration zone 512 occurs due to multiple electron scattering events transpiring therein. Moreover, electron-absorption substrate 410 includes a material of such a low atomic number or density such that electrons 311, upon crossing through directionally-filtering-backscattering layer 510, are absorbed in forward direction 412 by electron-absorption substrate 410 and the e-beam 310 penetrates deeply into electron-absorption substrate 410 with minimal electron backscattering.

In one embodiment, directionally-filtering-backscattering layer 510 has a mean atomic number greater than an atomic number of about 25, and is configured to permit a penetration of some electrons from e-beam 310, while deflecting others. For example, directionally-filtering-backscattering layer 510 has a sufficiently high atomic number or density such that electrons from e-beam 310 are backscattered by directionally-filtering-backscattering layer 510 directly under e-beam resist layer 210. A large proportion of electrons (not shown) that are backscattered from e-beam 310 by directionally-filtering-backscattering layer 510 travel through e-beam resist layer 210 a second time within primary-electron-exposed portion 230, causing additional exposure events enhancing the formation of the latent image therein. Electrons backscattered from e-beam 310 by directionally-filtering-backscattering layer 510 do not significantly contribute to the formation of the latent image of halo 250 around primary-electron-exposed portion 230 because the angular dispersion of their scattering intensity is peaked about the incident normal direction of e-beam 310, which is opposite to forward direction 412, so that a significant fraction of the electrons backscattered by directionally-filtering-backscattering layer 510 are within the lateral dimensions of e-beam 310, which define primary-electron-exposed portion 230.

On the other hand, directionally-filtering-backscattering layer 510 suppresses the number of backscattered electrons 520 produced in the substrate 410 that reach second portion 240. The backscattered electrons 520 produced in the substrate 410 have a larger angular divergence about the incident normal direction than the primary electrons in e-beam 310. Moreover, the backscattered electrons 520 produced in the substrate 410 have a significant component of linear momentum in a direction opposite to the forward direction 412 in which the primary electrons in e-beam 310 have the main component of their linear momentum. Directionally-filtering-backscattering layer 510 provides directional filtering with respect to the direction of the linear momentum of an incident electron. With regard to primary electrons from e-beam 310, directionally-filtering-backscattering layer 510 backscatters primary electrons from e-beam 310 incident on one side of directionally-filtering-backscattering layer 510 back into e-beam resist layer 210 to enhance the exposure due to these backscattered primary electrons from e-beam 310 in primary-electron-exposed portion 230. On the other hand, with regard to backscattered electrons 520 coming from the substrate 410, directionally-filtering-backscattering layer 510 re-backscatters backscattered electrons 520 coming from the substrate 410 away from e-beam resist layer 210 to suppress a spurious exposure due to the backscattered electrons coming from the substrate in second portion 240.

Moreover, directionally-filtering-backscattering layer 510 also has an effect on suppressing exposure due to electrons having a wide angular divergence, because primary electrons from e-beam 310 backscattered by directionally-filtering-backscattering layer 510 are backscattered in a pattern having narrower angular divergence about the incident normal direction than backscattered electrons 520 coming from the substrate 410. The difference in the angular spread, or divergence angle, between these two sources of backscattered electrons results in an enhancement of the latent image of primary-electron-exposed portion 230 from the fraction of primary electrons from e-beam 310 backscattered by directionally-filtering-backscattering layer 510 that reach primary-electron-exposed portion 230. On the other hand, if unimpeded by directionally-filtering-backscattering layer 510, a greater fraction of backscattered electrons 520 from the substrate 410 would reach e-beam resist layer 210 causing an undesirable, spurious exposure of second portion 240.

Consequently, this directional filtering effect of directionally-filtering-backscattering layer 510 on electrons incident upon directionally-filtering-backscattering layer 510 from its opposite sides increases the contrast of the latent image in the master mask both by limiting the effect of electron backscattering from the substrate on e-beam resist layer 210 and by enhancing the exposure of primary-electron-exposed portion 230 to primary electrons of e-beam 310 backscattered from directionally-filtering-backscattering layer 510, itself. It follows that an edge of primary-electron-exposed portion 230 will be significantly more pronounced upon subsequent development of the latent image of the physical pattern in e-beam resist layer 210 due to the increased contrast between the latent image in primary-electron-exposed portion 230 and the latent image in second portion 240. Nevertheless, the backscattering by directionally-filtering-backscattering layer 510 is a purely probabilistic effect. The filtering effect provided by the directionally-filtering-backscattering layer 510 is not that of an absolute filter, because due to the probabilistic nature of electron backscattering, directionally-filtering-backscattering layer 510 is fairly leaky with respect to electrons incident upon it from either electron-absorption substrate 410 or e-beam 310.

Figure 6:
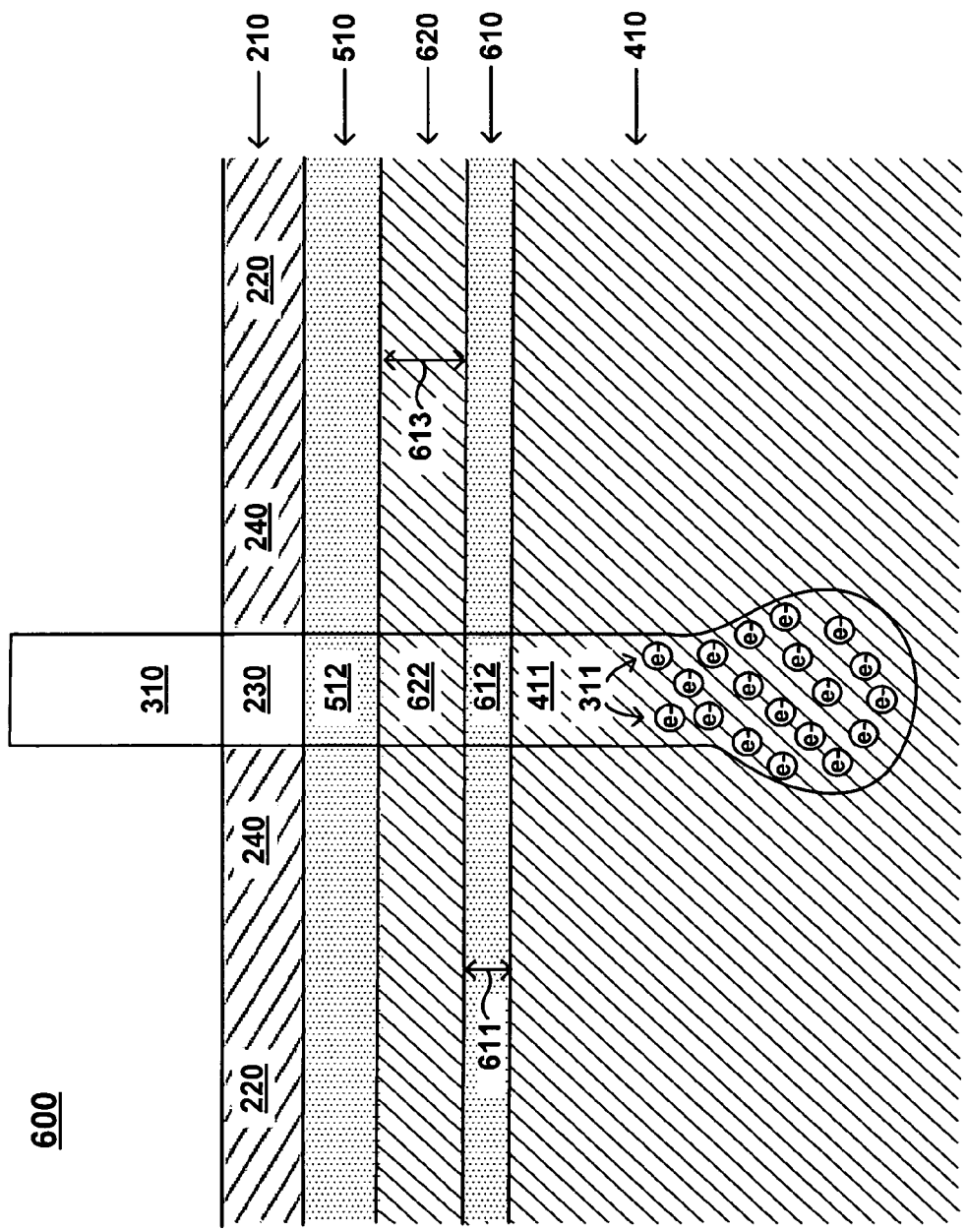
FIG. 6 is a cross-sectional view of a third master mask fabrication configuration in accordance with an embodiment of the present technology.

With reference now to FIG. 6, a third master mask fabrication configuration 600 in accordance with an embodiment is shown. An etch-stop layer 610 is included inside the fabricated master mask beneath a top portion of the high-resolution, patterned-media master mask and e-beam resist layer 210. After development of the latent image of the physical pattern in e-beam resist layer 210 to produce a plurality of openings in e-beam resist layer 210, and an etching, such as reactive-ion etching, or other means of removal, of material at the sites of the plurality of openings in e-beam resist layer 210 corresponding to the latent image, etch-stop layer 610 is utilized to control a height of a patterned portion corresponding to a replication feature during a patterning of a top portion of the high-resolution, patterned-media master mask. For example, as in a reactive-ion etching, etch-stop layer 610 includes a material, such as a rhodium (Rh), having different etching characteristics than a material used for a top portion of the high-resolution, patterned-media master mask, so that the rhodium (Rh) layer stops an etching during a patterning of the high-resolution, patterned-media master mask.

In an embodiment, the etching resistance of etch-stop layer 610 is sufficiently high such that etch-stop layer 610 is not extremely thick relative to the other physical layers of the master mask. For example, the thickness 611 of etch-stop layer 610 is around a few monolayers, or approximately 1 to 5 nanometers (nm). In addition, in one embodiment, etch-stop layer 610 includes a material that is sufficiently thin to permit a penetration of electrons from e-beam 310 through a portion 612 of etch-stop layer 610. Therefore, portion 612 of etch-stop layer 610 aids in the absorption of electrons during the e-beam exposure by the e-beam lithography process such that these electrons are not significantly backscattered by portion 612 of etch-stop layer 610, such that detrimental effects on the resolution of the latent image of primary-electron-exposed portion 230 are precluded.

With further reference to FIG. 6, an embodiment provides that etch-stop layer 610 is disposed on electron-absorption substrate 410 and under a patternable layer 620 having a vertical displacement 613. Vertical displacement 613 is selected based on the desired vertical dimensions of the physical protrusions, replication features, specified for the top surface of the master mask, which will be used for creating impressions in the daughter molds during the pattern replication process. Consider the example where patternable layer 620 has a patterned portion 622 that is patterned by etching after exposure of e-beam resist layer 210 to e-beam 310 and development of the primary-electron-exposed portion 230. The interposition of etch-stop layer 610 under patterned portion 622 provides an etch resistant boundary in the master mask that controls a height of at least one edge of the patterned portion during a patterning of the high-resolution, patterned-media master mask. Vertical displacement 613 controls the height of at least one edge of patterned portion 622, if the directionally-filtering-backscattering layer 510 is absent, sufficiently thin, or subsequently removed from the surface of the high-resolution, patterned-media master mask in subsequent fabrication processes, such as chemical-mechanical polishing (CMP) of the surface of the high-resolution, patterned-media master mask.

Thus, various embodiments illustrate that vertical dimensions of the master mask may be controlled using etch-stop layer 610. Moreover, various embodiments also enable both lateral control over the diameter of the primary-electron latent image in the master mask, as well as vertical control over the height of the protrusions, replication features, which make up the fabricated pattern. This dual control technique is of significant value during the fabrication process of patterned-media because the quality of the pattern produced in the replicated media is dependent on the quality of the fabricated dimensions in the master mask.

Selective Electron Capture

Various types of electron scattering events transpire during the e-beam exposure by the e-beam lithography process. In elastic scattering, the majority of the kinetic energy of an electron is essentially conserved in a collision with a much more massive atom, so that the propagating direction of the electron is changed in an elastic scattering event. Backscattered electrons are generally the result of elastic scattering events wherein these electrons travel in a first direction, come into contact with various atoms, such as atoms located in a layer of a master mask, and are then deflected in a second direction. However, backscattered electrons possess a relatively high level of kinetic energy when compared to the primary electrons in e-beam 310, because they have not lost a significant amount of kinetic energy as a result of the elastic nature of the scattering process.

However, scattering events that result from e-beam exposure by the e-beam lithography process are not limited to elastic scattering events. Inelastic scattering events also take place, wherein the incident electron loses kinetic energy in a collision with an atom in electron-absorption substrate 410. Secondary electrons 710 are an example of the products of inelastic scattering events. Secondary electrons 710 are generated as the products of ionization, and generally possess relatively low kinetic energies.

Consider an example where e-beam 310 has a kinetic energy of approximately 100,000 electronvolts (eV). Ionizations produced by e-beam 310 cause secondary electrons 710 to be released as low-kinetic-energy electrons, wherein secondary electrons 710 generally have kinetic energies of less than 100 eV, and wherein the median kinetic energy for secondary electrons 710 is around 50 eV. Thus, when compared to the 100,000 eV kinetic energy of the primary beam, secondary electrons 710 possess a relatively low amount of kinetic energy.

Figure 7:
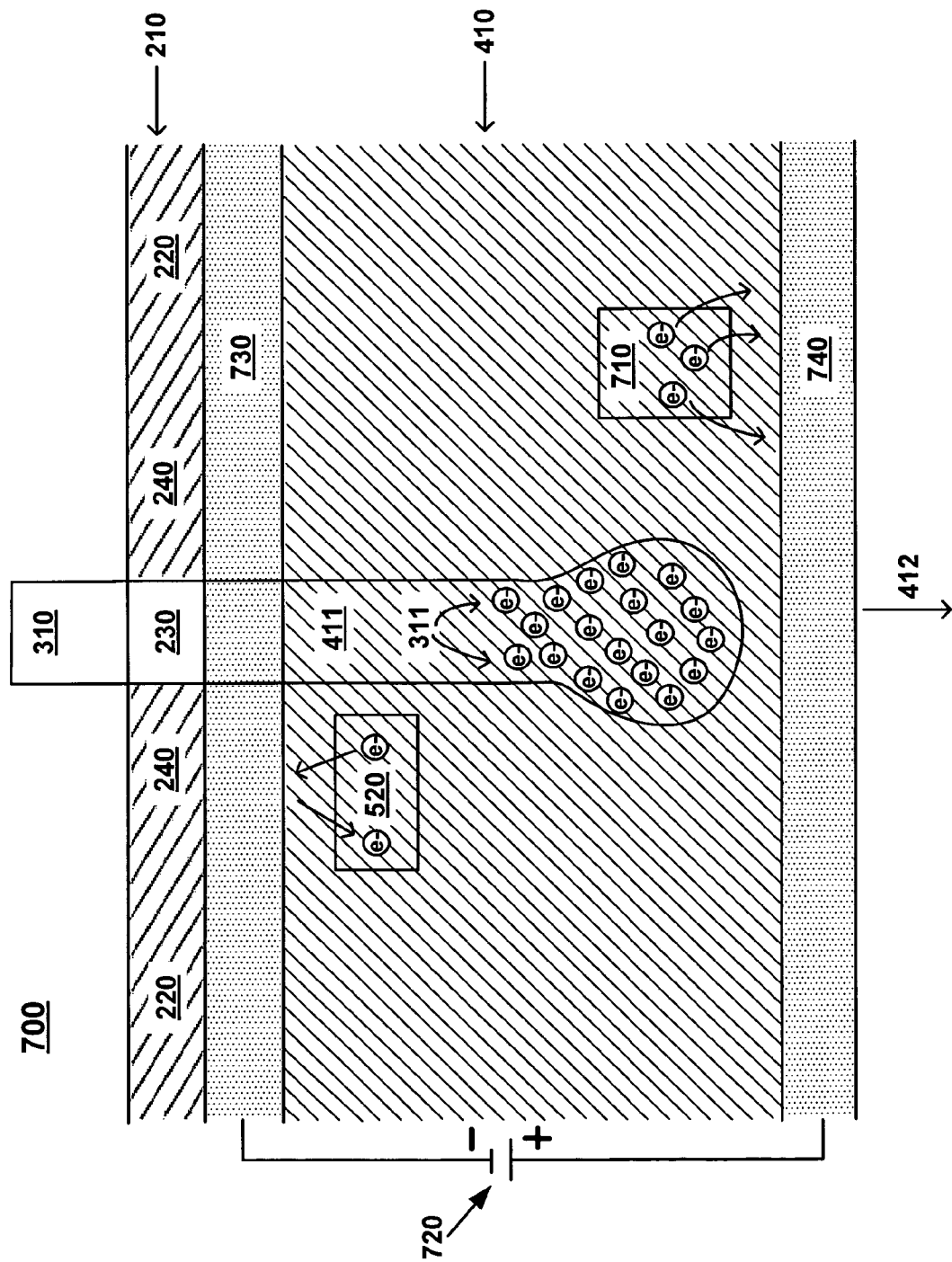
FIG. 7 is a cross-sectional view of a fourth master mask fabrication configuration in accordance with an embodiment of the present technology.

To further illustrate, and with reference now to FIG. 7, a fourth master mask fabrication configuration 700 in accordance with an embodiment is shown. A number of electrons 311 enter electron-absorption substrate 410 in forward direction 412. However, a number of secondary electrons 710 are produced within electron-absorption substrate 410. Secondary electrons 710 are produced as a result of ionization events that take place in electron-absorption substrate 410 when primary electrons from e-beam 310 enter into area 411. When secondary electrons 710 leave the substrate and collide with second portion 240, the latent image of halo 250 is created around primary-electron-exposed portion 230, as shown in FIG. 2.

In an embodiment, a biasing scheme is utilized to capture secondary electrons 710 during the e-beam exposure by the e-beam lithography process such that secondary electrons 710 do not adversely affect a resolution of the primary-electron latent image in the fabricated master mask. In particular, an embodiment utilizes a voltage source 720 to apply a voltage across electron-absorption substrate 410 so as to cause secondary electrons 710 to travel in a direction away from e-beam resist layer 210. In one example, the voltage applied by voltage source 720 is approximately 100 volts (V), and this 100 V threshold is sufficient to repel nearly all secondary electrons 710 away from e-beam resist layer 210 due to the low kinetic energy of secondary electrons 710.

With reference still to FIG. 7, a first electrically conductive layer 730 is disposed on a first side of electron-absorption substrate 410, and a second electrically conductive layer 740 is disposed on a second side of electron-absorption substrate 410 such that the application of voltage by voltage source 720 across first electrically conductive layer 730 and second electrically conductive layer 740 by voltage source 720 causes secondary electrons 710 to be attracted to second electrically conductive layer 740 and repelled away from first electrically conductive layer 730 and e-beam resist layer 210. In this manner, fourth master mask fabrication configuration 700 suppresses the number of secondary electrons 710 produced in electron-absorption substrate 410 that travel toward e-beam resist layer 210 so as to decrease an exposure of e-beam resist layer 210 due to secondary electrons 710 and to increase a resolution at the edge of primary-electron-exposed portion 230.

Various types of materials may be utilized to create first electrically conductive layer 730 and second electrically conductive layer 740. In one example, the electrically conductive layers include metallic materials that exhibit a high level of electrical conductivity. However, in an alternative embodiment, these layers include highly conductive semiconductor layers, such as degenerately-doped silicon, heavily boron-doped silicon, or various other semiconductor layers.

The foregoing notwithstanding, the embodiments illustrated in FIG. 7 show that first electrically conductive layer 730 is disposed between e-beam resist layer 210 and electron-absorption substrate 410. Moreover, second electrically conductive layer 740 is positively charged with respect to first electrically conductive layer 730. Secondary electrons 710 are consequently attracted to second electrically conductive layer 740, and simultaneously repelled away from first electrically conductive layer 730, due to the negative electrical charge of secondary electrons 710. Thus, the application of voltage applied by voltage source 720 across electron-absorption substrate 410 causes secondary electrons 710 to travel away from first electrically conductive layer 730 and toward second electrically conductive layer 740.

In one embodiment, first electrically conductive layer 730 is further configured to resist a penetration of backscattered electrons 520. Consider the example where first electrically conductive layer is configured to exhibit the same or similar functional characteristics as directionally-filtering-backscattering layer 510. First electrically conductive layer 730 permits a penetration of electrons 311 from e-beam 310 such that electrons 311 pass through first electrically conductive layer 730 and enter electron-absorption substrate 410. In addition, a number of these electrons 311 collide with atoms in electron-absorption substrate 410 and are backscattered toward second portion 240 of e-beam resist layer 210. However, first electrically conductive layer 730 suppresses the penetration of backscattered electrons 520. In particular, backscattered electrons 520 are deflected by first electrically conductive layer 730, which functions in a manner substantially similar to directionally-filtering-backscattering layer 510 such that backscattered electrons 520 moving towards second portion 240 are suppressed. Thus, an embodiment provides for the sequestering of both backscattered electrons 520 and secondary electrons 710 in order to further maximize the resolution of the latent image in the master mask.

Moreover, pursuant to one embodiment, voltage source 720 is a battery configured to chemically store electric energy such that voltage source 720 provides a voltage across electron-absorption substrate 410 when electrical leads of voltage source 720 are electrically coupled with first electrically conductive layer 730 and second electrically conductive layer 740. Alternatively, however, the voltage applied by voltage source 720 may be applied by a variety of other techniques. For example, voltage source 720 is utilized to apply a voltage differential with reference to a ground plane using a direct current (dc) power supply other than a battery. In another example, the voltage applied by voltage source 720 is a positive biasing voltage relative to a ground reference of an electron gun used during the e-beam exposure by the e-beam lithography process, and is utilized to suppress secondary and low kinetic energy electrons generated beneath e-beam resist layer 210 from reaching the latent image in the master mask.

With reference again to the embodiment illustrated in FIG. 7, second electrically conductive layer 740 is shown to be positively charged with respect to first electrically conductive layer 730. This configuration allows secondary electrons 710 to be attracted to second electrically conductive layer 740 and repelled away from first electrically conductive layer 730 and e-beam resist layer 210. However, in an alternative embodiment, this polarity is switched such that first electrically conductive layer 730 is positively charged with respect to second electrically conductive layer 740. This configuration allows low kinetic energy electrons associated with e-beam 310 to be attracted toward first electrically conductive layer 730 opposite to forward direction 412 such that these low kinetic energy electrons are captured by first electrically conductive layer 730 and precluded from reaching second portion 240 subsequent to being generated by e-beam 310 in electron-absorption substrate 410.

Fourth master mask fabrication configuration 700 is of significant importance to the field of e-beam lithography because secondary electrons 710 can often be more destructive to the lithography process than backscattered electrons 520, even though backscattered electrons 520 generally possess much more kinetic energy than secondary electrons 710. One explanation for this phenomenon is that the exposure of the e-beam resist layer 210 is due to induced ionization events occurring within e-beam resist layer 210. However, high kinetic energy electrons often pass through e-beam resist layer 210 without inducing ionization, whereas lower kinetic energy electrons, such as secondary electrons 710, are particularly effective in causing ionization events in e-beam resist layer 210. One embodiment provides a means of configuring the structure of the master mask so as to selectively absorb electrons in different ways depending on the respective kinetic energies of these electrons. In this manner, the electron absorption structure of the master mask becomes increasingly specialized and efficient.

Alternative embodiments, various structural configurations, or portions thereof, described herein are altered or combined so as to provide an even greater degree of structural integrity to a master mask, while simultaneously maximizing pattern resolution. For example, one or more of the electrically conductive layers may itself be from a reactive-ion, etch-stop material, such as a rhodium. In this manner, the horizontal dimensions of the latent image are controlled by sequestering secondary electrons 710 during the e-beam exposure by the e-beam lithography process of the master mask, while the vertical dimensions of the lithographically generated pattern are protected during a subsequent patterning of the master mask.

In so far as a significant amount of the undesirable exposure of the e-beam resist layer 210 is also due to secondary electrons, for embodiments of the present technology, it is possible to use a material for electron-absorption substrate 410 composed of greater than fifty atomic percent of a constituent atomic species having an electron-backscattering-suppressing atomic number greater than atomic number seven and yet have a significant reduction of the over all halo effect due to both secondary and backscattered electrons. In addition to materials composed of greater than fifty atomic percent of a constituent atomic species having an electron-backscattering-suppressing atomic number less than an atomic number eight, various other materials may also be used to create electron-absorption substrate 410, when electron-absorption substrate 410 is used in conjunction with the biasing scheme described above. In one embodiment, electron-absorption substrate 410, when used in conjunction with the biasing scheme described above, includes a material composed of greater than fifty atomic percent of a constituent atomic species having an atomic number less than or equal to that of silicon. Consider the example where a significant number, greater than fifty atomic percent, of constituent atomic species in electron-absorption substrate 410 have electron-backscattering-suppressing atomic numbers less than an atomic number fifteen. This is exclusive, for example, of various trace atomic impurities that may be present in the material. In order to obtain a significant effect from the overall reduction of both secondary and backscattered electrons coming from electron-absorption substrate 410, when used in conjunction with the biasing scheme described above, most, greater than fifty atomic percent, of the constituent atomic species composing the material of electron-absorption substrate 410 have electron-backscattering-suppressing atomic numbers less than an atomic number fifteen, which is one greater than the atomic number of silicon, fourteen.

In one embodiment, electron-absorption substrate 410, when used in conjunction with the biasing scheme described above, includes a material composed of greater than fifty atomic percent of constituent atomic species having an atomic number less than or equal to that of silicon. For example, electron-absorption substrate 410 includes a material selected not only from a group consisting of carbon (C), pyrolytic graphite, diamond-like carbon (DLC), cathodic-arc carbon (CAC), lithium (Li), beryllium (Be), boron carbide ($B_4C$), boron nitride (BN), and nitride of carbon ($CN_x$), but also from a group consisting of silicon (Si) including its various doped forms, such as heavily boron-doped silicon or heavily phosphorus-doped silicon, silicon dioxide ($SiO_2$) including materials consisting primarily of silicon dioxide, such as various glasses and quartz, silicon nitride ($Si_3N_4$), silicon carbide (SiC), alumina ($Al_2O_3$) including its various forms, such as sputtered alumina and sapphire, and beryllium oxide (BeO). As the highest atomic number of constituent atomic species in these materials is that of silicon, which has atomic number fourteen, a significant number, greater than fifty atomic percent, of constituent atomic species in electron-absorption substrate 410 have electron-backscattering-suppressing atomic numbers less than an atomic number fifteen, which is one more than the atomic number of Si.

In an embodiment of the present technology, a second electrically conductive layer 740 need not be disposed on a second side of electron-absorption substrate 410 if the substrate, itself, is already conductive. Rather, second side of electron-absorption substrate 410 may be chosen as a first bias point at which to connect a first lead from the voltage source 720, e.g. positive lead from voltage source 720. Moreover, it is not necessary to connect the voltage source 720 to second side of electron-absorption substrate 410 but only at point along the side of electron-absorption substrate 410 sufficiently below first side of electron-absorption substrate 410 to capture the secondary electrons 710. Similarly, first electrically conductive layer 730 need not be disposed on first side of electron-absorption substrate 410 if the substrate, itself, is already conductive. Rather, first side of electron-absorption substrate 410 may be chosen as a second bias point at which to connect a second lead from the voltage source 720, e.g. negative lead from voltage source 720. If electron-absorption substrate 410 is already electrically conductive, the top portion, top side, of electron-absorption substrate 410 provides the equivalent function of a first electrically conductive layer 730 disposed on first side of electron-absorption substrate 410, and the bottom potion, back side, or side portions of electron-absorption substrate 410 provide the equivalent function of a second electrically conductive layer 740 disposed on second side of electron-absorption substrate 410. Thus, an electrically conductive, electron-absorption substrate 410 is functionally equivalent to an electron-absorption substrate 410 with a first electrically conductive layer 730 disposed on first side of electron-absorption substrate 410 and a second electrically conductive layer 740 disposed on second side of electron-absorption substrate 410.

For example, an embodiment of the present technology includes the following: beryllium as electron-absorption substrate 410; and the back side of the beryllium substrate as the positive bias point for voltage source 720, and the top side of the beryllium substrate as the negative bias point for voltage source 720. For this embodiment, the thickness of the beryllium substrate may be a few millimeters (mm) thick, between about 1 mm to about 10 mm.

Also, in an embodiment, an intervening mechanically hard, electron-absorbing layer, e.g. patternable layer 620, that includes a material composed of greater than fifty atomic percent of constituent atomic species having an atomic number less than or equal to that of silicon may be disposed on first side of electron-absorption substrate 410; and if the intervening layer, itself, is already conductive, the top surface of the intervening layer may be chosen as a second bias point at which to connect a second lead from the voltage source 720, e.g. negative lead from voltage source 720. On the other hand, in an embodiment, if the intervening layer is non-conductive, first electrically conductive layer 730 may be disposed on the top surface of the intervening layer and the second bias point at which to connect a second lead from the voltage source 720, e.g. negative lead from voltage source 720, may be chosen at some location on first electrically conductive layer 730.

For example, an embodiment of the present technology includes the following: beryllium as electron-absorption substrate 410; a diamond-like carbon (DLC) layer deposited by a cathodic arc process on the top side of the beryllium substrate as patternable layer 620 providing the intervening mechanically hard, electron-absorbing layer; and a thin tantalum (Ta) layer, between about 1 nm to 5 nm thick, as first electrically conductive layer 730; and the back side of the beryllium substrate as the positive bias point for voltage source 720, and the top surface of the thin tantalum layer as the negative bias point for voltage source 720. For this embodiment, the thickness of the beryllium substrate may be a few millimeters (mm) thick, between 1 mm and 10 mm; the thickness of the diamond-like carbon layer may be between about 10 nm to about 150 nm thick; and the applied voltage may be between about 30 volts to about 200 volts. In addition, an etch-stop layer 610 including rhodium (Rh) of about 1 nm to about 5 nm thick may be disposed between electron-absorption substrate 410 and patternable layer 620.

Method of Operation

With reference now to FIG. 8, a method 800 of increasing a resolution of a physical pattern in a patterned-media master mask in accordance with an embodiment is shown. Method 800 includes providing an e-beam resist comprising material that produces a latent image in the material in response to an exposure of the material to electrons during an e-beam lithography 810, selecting an electron-absorption substrate comprising a material composed of greater than fifty atomic percent of a constituent atomic species having an electron-backscattering-suppressing atomic number less than an atomic number eight 820, and coupling the e-beam resist with the electron-absorption substrate such that the electron-absorption substrate is configured to absorb the electrons during the e-beam lithography 830. Method 800 further includes utilizing an e-beam to produce the latent image in the e-beam resist, wherein the latent image provides a representative image of the physical pattern 840, utilizing the electron-absorption substrate to suppress a backscattering of the electrons based on the electron-backscattering-suppressing atomic number so as to decrease an exposure of the e-beam resist to the backscattering of the electrons 850, and developing the latent image in the e-beam resist to produce the physical pattern, wherein the resolution of the physical pattern is increased in response to the utilizing of the electron-absorption substrate to suppress the backscattering of the electrons 860.

In an embodiment, method 800 further includes coupling a directionally-filtering-backscattering medium with the electron-absorption substrate, and utilizing the directionally-filtering-backscattering medium to deflect backscattered electrons produced in the electron-absorption substrate away from the e-beam resist. Consider the example where the directionally-filtering-backscattering medium is disposed between the e-beam resist and the electron-absorption substrate. The directionally-filtering-backscattering medium is utilized to suppress a penetration of backscattered electrons.

In this manner, these backscattered electrons are hindered by the directionally-filtering-backscattering medium from traveling in a direction toward the e-beam resist such that the resolution of an edge of the primary-electron-exposed portion of the e-beam resist is further increased, and a resolution of the patterned portion is increased in response to the electron-absorption substrate suppressing the backscattering of the electrons.

In one embodiment, method 800 also includes utilizing the directionally-filtering-backscattering medium to increase an exposure of the primary-electron-exposed portion to primary electrons backscattered by the directionally-filtering-backscattering medium. For example, exposure to electrons from an e-beam used in the e-beam exposure of the e-beam resist creates the primary-electron-exposed portion. The directionally-filtering-backscattering medium is used to increase the exposure of the primary-electron-exposed portion to the electrons from the e-beam by deflecting at least a portion of these electrons toward the primary-electron-exposed portion. Increasing the exposure of the primary-electron-exposed portion helps to further distinguish a boundary of a lithographically created latent image in the e-beam resist. In this manner, the resolution of the physical pattern in the high-resolution, patterned-media master mask is increased.

Moreover, in an embodiment, method 800 further includes coupling the electron-absorption substrate between first and second electrically conductive mediums, and applying a voltage across the first and second electrically conductive mediums such that a number of secondary electrons produced in the electron-absorption substrate are prevented from traveling toward the e-beam resist. Consider the example wherein the first electrically conductive medium is disposed on a first side of the electron-absorption substrate, and wherein the second electrically conductive medium is disposed on a second side of the electron-absorption substrate. The application of the voltage across the first and second electrically conductive mediums by the voltage source causes secondary electrons in the electron-absorption substrate to be attracted to the second electrically conductive medium and repelled away from the first electrically conductive medium and away from the e-beam resist medium. In this manner, the number of electrons in the electron-absorption substrate that travel toward the e-beam resist is decreased such that a resolution of an edge of the primary-electron-exposed portion is increased, and a resolution of the patterned portion is increased in response to the electron-absorption substrate suppressing the backscattering of the electrons.

In one embodiment, method 800 further includes coupling the first electrically conductive medium between the e-beam resist and the electron-absorption substrate, and utilizing the first electrically conductive medium to deflect a number of backscattered electrons produced in the electron-absorption substrate away from the e-beam resist. For instance, in addition to being used to implement an electric biasing scheme to capture secondary electrons, the first electrically conductive medium is oriented within the high-resolution, patterned-media master mask so as to suppress the penetration of backscattered electrons. In this manner, a trajectory of the backscattered electrons is altered such that these backscattered electrons begin to travel in a new direction away from the e-beam resist. This enables the resolution of an edge of the primary-electron-exposed portion of the e-beam resist to be further increased such that a resolution of the patterned portion is increased in response to the electron-absorption substrate suppressing the backscattering of the electrons.

Furthermore, in an embodiment, method 800 also includes coupling an etch-stop medium with the electron-absorption substrate, and utilizing the etch-stop medium to control a height of at least one edge of the physical pattern during a patterning of the patterned-media master mask. For example, an etch-stop medium is disposed beneath a patternable medium which is disposed under the e-beam resist. The etch-stop medium includes a material having etching characteristics that enable the etch-stop medium to arrest an etching during a patterning of the master mask. Moreover, the etch-stop medium is utilized to protect the vertical dimensions of the lithographically generated pattern in the patterned portion of the patternable medium of the master mask. The etch-stop medium therefore provides an increased level of vertical control over the dimensions of the lithographically generated pattern in the patterned-media master mask during the fabrication process.

While various embodiments have been disclosed herein, the present technology may be practiced without the specific details of these embodiments. Moreover, although various embodiments present possible structural configurations of example master masks, these structural examples are not meant to limit the spirit or scope of the present technology. Indeed, further structural components may also be utilized during the fabrication of high-resolution, patterned-media master masks, as well as for the general purpose of maximizing resolutions of e-beam lithography generated patterns. Moreover, various procedures, components, and circuits have not been described in detail as not to unnecessarily obscure aspects of the present embodiments.

Furthermore, although embodiments have been described in the context of generating high-resolution, patterned-media master masks, various embodiments described herein are useful outside of the art of master mask fabrication, such as in applications involving the suppression of electron backscattering events or ionization events involving secondary electrons. Indeed, the e-beam lithography of a high-resolution, patterned-media master mask is an embodiment that has been presented herein merely for purposes of brevity and clarity.

Moreover, although specific steps of various methods of implementation are disclosed herein, these steps are examples of steps that may be performed in accordance with various embodiments. That is, various embodiments perform other steps, or variations of the steps recited. In addition, the steps disclosed herein may be performed in an order different than presented, and that not all of the steps are necessarily performed in a particular embodiment. Finally, pursuant to various embodiments, one or more steps may be performed manually, such as by a manufacturing technician.

The foregoing descriptions of specific embodiments of the present technology have been presented for purposes of illustration and description. They are not intended to be exhaustive or to limit the technology to the precise forms disclosed, and many modifications and variations are possible in light of the above teachings. The embodiments described herein were chosen and described in order to best explain principles of the technology, and various practical applications thereof, so as to enable others skilled in the art to implement embodiments of the technology with various modifications as are suited to the particular use contemplated. It is intended that the scope of the technology be defined by the Claims appended hereto and their equivalents.

However, although the subject matter has been described in a language specific to structural features and/or methodological acts, the subject matter defined in the appended Claims is not necessarily limited to the specific features or acts described above. Rather, the specific features and acts described above are disclosed as examples of implementing the Claims.

What is claimed is:

1. A high-resolution, patterned-media master mask comprising:

an electron-absorption substrate for absorbing electrons from an electron beam (e-beam) during an e-beam exposure by an e-beam lithography process and suppressing a backscattering of said electrons based on an electron-backscattering-suppressing atomic number associated with a constituent atomic species of said electron-absorption substrate, wherein said electron-absorption substrate comprises a material composed of greater than fifty atomic percent of said constituent atomic species, and wherein said electron backscattering-suppressing atomic number is less than an atomic number eight; and a patterned portion coupled with said electron-absorption substrate, wherein said patterned portion is patterned by said e-beam lithography process, and wherein a resolution of said patterned portion is increased in response to said electron-absorption substrate suppressing said backscattering of said electrons.

2. The high-resolution, patterned-media master mask of claim 1, wherein said electron-absorption substrate comprises a material selected from a group consisting of carbon (C), pyrolytic graphite, diamond-like carbon (DLC), cathodic-arc carbon (CAC), lithium (Li), beryllium (Be), boron carbide ($B_4C$), boron nitride (BN), and nitride of carbon ($CN_x$).

3. The high-resolution, patterned-media master mask of claim 1, wherein said electron-absorption substrate has an electron-backscattering-suppressing density that is less dense than a density of carbon (C).

4. The high-resolution, patterned-media master mask of claim 1, further comprising a directionally-filtering-backscattering medium coupled with said electron-absorption substrate, said directionally-filtering-backscattering medium having a mean atomic number greater than an atomic number of approximately 25.

5. The high-resolution, patterned-media master mask of claim 4, wherein said patterned portion comprises an e-beam resist, and wherein said directionally-filtering-backscattering medium deflects backscattered electrons produced in said electron-absorption substrate away from said e-beam resist during said e-beam exposure by said e-beam lithography process and increases an exposure of a primary-electron-exposed portion of said e-beam resist to primary electrons backscattered by said directionally-filtering-backscattering medium.

6. The high-resolution, patterned-media master mask of claim 5, further comprising first and second electrically conductive mediums, wherein said electron-absorption substrate is disposed between said first and, second electrically conductive mediums such that an application of a voltage across said first and second electrically conductive mediums suppresses a number of secondary electrons produced in said electron-absorption substrate that travel toward said e-beam resist during said e-beam exposure by said e-beam lithography process.

7. The high-resolution, patterned-media master mask of claim 1, further comprising an etch-stop medium coupled with said electron-absorption substrate, said etch-stop medium controlling a height of at least one edge of said patterned portion during a patterning of said high-resolution, patterned-media master mask.

8. A system for generating a high-resolution, patterned-media master mask, said system comprising:

an electron-absorption substrate for absorbing electrons during an electron beam (e-beam) exposure by an e-beam lithography process and suppressing a backscattering of said electrons;

a first electrically conductive medium coupled with a first side of said electron-absorption substrate;

a second electrically conductive medium coupled with a second side of said electron-absorption substrate;

an e-beam resist coupled with said electron-absorption substrate, said e-beam resist comprising a primary-electron-exposed portion in response to being exposed to said electrons; and a voltage source for applying a voltage across said first and second electrically conductive mediums, said voltage suppressing a number of secondary electrons produced in said electron-absorption substrate that travel toward said e-beam resist so as to decrease an exposure of said e-beam resist due to said secondary electrons such that a resolution of said primary-electron-exposed portion is increased.

9. The system of claim 8, wherein said first electrically conductive medium is coupled between said e-beam resist and said electron-absorption substrate, and wherein said second electrically conductive medium is positively charged with respect to said first electrically conductive medium.

10. The system of claim 8, wherein said first electrically conductive medium deflects backscattered electrons produced in said electron-absorption substrate away from said e-beam resist and backscatters a number of primary electrons toward said primary-electron-exposed portion such that said resolution of said primary-electron-exposed portion is further increased.

11. The system of claim 8, further comprising an etch-stop medium coupled with said electron-absorption substrate, said etch-stop medium controlling a height of at least one edge of a patterned portion of said high-resolution, patterned-media master mask during a patterning of said high-resolution, patterned-media master mask.

12. The system of claim 8, wherein said electron-absorption substrate comprises a material composed of greater than fifty atomic percent of a constituent atomic species having an electron-backscattering-suppressing atomic number less than an atomic number fifteen.

13. The system of claim 8, wherein said electron-absorption substrate has an electron-backscattering-suppressing density that is less dense than a density of carbon (C).

14. The system of claim 8, wherein said electron-absorption substrate comprises a material selected from a group consisting of carbon (C), pyrolytic graphite, diamond-like carbon (DLC), cathodic-arc carbon (CAC), lithium (Li), beryllium (Be), boron carbide ($B_4C$), boron nitride (BN), nitride of carbon (CNx), silicon (Si), silicon dioxide ($SiO_2$), glass, quartz, silicon nitride ($Si_3N_4$), silicon carbide (SiC), alumina ($Al_2O_3$), sapphire, and beryllium oxide (BeO).

15. A method of increasing a resolution of a physical pattern in a patterned-media master mask, said method comprising:

providing an electron beam (e-beam) resist comprising material that produces a latent image in said material in response to an exposure of said material to electrons during an e-beam lithography;

selecting an electron-absorption substrate comprising a material composed of greater than fifty atomic percent of a constituent atomic species having an electron-backscattering-suppressing atomic number less than an atomic number eight;

coupling said e-beam resist with said electron-absorption substrate such that said electron-absorption substrate is configured to absorb said electrons during said e-beam lithography;

utilizing an e-beam to produce said latent image in said e-beam resist, said latent image providing a representative image of said physical pattern;

utilizing said electron-absorption substrate to suppress a backscattering of said electrons based on said electron-backscattering-suppressing atomic number so as to decrease an exposure of said e-beam resist to said backscattering of said electrons;

developing said latent image in said e-beam resist to produce said physical pattern, wherein said resolution of said physical pattern is increased in response to said utilizing of said electron-absorption substrate to suppress said backscattering of said electrons.

16. The method of claim 15, further comprising:

coupling a directionally-filtering-backscattering medium with said electron-absorption substrate; and utilizing said directionally-filtering-backscattering medium to deflect backscattered electrons produced in said electron-absorption substrate away from said e-beam resist.

17. The method of claim 16, further comprising:

utilizing said directionally-filtering-backscattering medium to increase an exposure of said primary-electron-exposed portion to primary electrons backscattered by said directionally-filtering-backscattering medium.

18. The method of claim 15, further comprising:

coupling an etch-stop medium with said electron-absorption substrate; and utilizing said etch-stop medium to control a height of at least one edge of said physical pattern during a patterning of said patterned-media master mask.

19. The method of claim 15, further comprising:

coupling said electron-absorption substrate between first and second electrically conductive mediums; and applying a voltage across said first and second electrically conductive mediums such that a number of secondary electrons produced in said electron-absorption substrate are prevented from traveling toward said e-beam resist.

20. The method of claim 19, further comprising:

coupling said first electrically conductive medium between said e-beam resist and said electron-absorption substrate; and utilizing said first electrically conductive medium to deflect a number of backscattered electrons produced in said electron-absorption substrate away from said e-beam resist.

* * * * *